(12) United States Patent
Wieland

(10) Patent No.: US 11,984,295 B2
(45) Date of Patent: May 14, 2024

(54) CHARGED PARTICLE ASSESSMENT TOOL, INSPECTION METHOD

(71) Applicant: ASML NETHERLANDS B.V., Veldhoven (NL)

(72) Inventor: Marco Jan-Jaco Wieland, Delft (NL)

(73) Assignee: ASML NETHERLANDS B.V., Veldhoven (NL)

( * ) Notice: Subject to any disclaimer, the term of this patent is extended or adjusted under 35 U.S.C. 154(b) by 201 days.

(21) Appl. No.: 17/790,713

(22) PCT Filed: Dec. 23, 2020

(86) PCT No.: PCT/EP2020/087777
§ 371 (c)(1),
(2) Date: Jul. 1, 2022

(87) PCT Pub. No.: WO2021/140035
PCT Pub. Date: Jul. 15, 2021

(65) Prior Publication Data
US 2023/0054632 A1    Feb. 23, 2023

(30) Foreign Application Priority Data

| Jan. 6, 2020 | (EP) | 20150394 |
| Jul. 6, 2020 | (EP) | 20184160 |
| Sep. 24, 2020 | (EP) | 20198201 |

(51) Int. Cl.
*H01J 37/317* (2006.01)
*H01J 37/12* (2006.01)
(Continued)

(52) U.S. Cl.
CPC .......... *H01J 37/3177* (2013.01); *H01J 37/12* (2013.01); *H01J 37/1474* (2013.01);
(Continued)

(58) Field of Classification Search
CPC ...... H01J 37/12; H01J 37/1474; H01J 37/153; H01J 37/20; H01J 37/244; H01J 37/265;
(Continued)

(56) References Cited

U.S. PATENT DOCUMENTS

| 5,384,463 A | 1/1995 | Honjo et al. |
| 5,557,105 A | 9/1996 | Honjo et al. |

(Continued)

FOREIGN PATENT DOCUMENTS

| EP | 1619495 | 1/2006 |
| EP | 2267752 | 12/2010 |

(Continued)

OTHER PUBLICATIONS

Taiwanese Office Action issued in corresponding Taiwanese Patent Application No. 109146794, dated Aug. 10, 2022.
(Continued)

*Primary Examiner* — Sean M Luck
(74) *Attorney, Agent, or Firm* — Pillsbury Winthrop Shaw Pittman, LLP

(57) ABSTRACT

A charged particle assessment tool including: an objective lens configured to project a plurality of charged particle beams onto a sample, the objective lens having a sample-facing surface defining a plurality of beam apertures through which respective ones of the charged particle beams are emitted toward the sample; and a plurality of capture electrodes, each capture electrode adjacent a respective one of the beam apertures, configured to capture charged particles emitted from the sample.

20 Claims, 10 Drawing Sheets

(51) Int. Cl.
  *H01J 37/147* (2006.01)
  *H01J 37/153* (2006.01)
  *H01J 37/20* (2006.01)
  *H01J 37/244* (2006.01)
  *H01J 37/26* (2006.01)
  *H01J 37/28* (2006.01)

(52) U.S. Cl.
  CPC ............ *H01J 37/153* (2013.01); *H01J 37/20* (2013.01); *H01J 37/244* (2013.01); *H01J 37/265* (2013.01); *H01J 37/28* (2013.01); *H01J 2237/0453* (2013.01); *H01J 2237/1532* (2013.01); *H01J 2237/2817* (2013.01)

(58) Field of Classification Search
  CPC ................... H01J 37/28; H01J 37/3177; H01J 2237/0453; H01J 2237/1532; H01J 2237/2817
  See application file for complete search history.

(56) References Cited

U.S. PATENT DOCUMENTS

| | | | |
|---|---|---|---|
| 5,666,053 | A | 9/1997 | Suzuki et al. |
| 6,201,240 | B1 | 3/2001 | Dotan et al. |
| 6,566,655 | B1 | 5/2003 | Choo et al. |
| 7,332,729 | B1 | 2/2008 | Muray et al. |
| 7,569,834 | B1 | 8/2009 | Richardson |
| 7,880,143 | B2 | 2/2011 | Tanimoto et al. |
| 8,698,094 | B1 | 4/2014 | Sears et al. |
| 9,869,650 | B2 | 1/2018 | Kikuiri |
| 2001/0028038 | A1 | 10/2001 | Hamaguchi et al. |
| 2002/0160311 | A1 | 10/2002 | Muraki et al. |
| 2003/0085360 | A1 | 5/2003 | Parker et al. |
| 2003/0132382 | A1 | 7/2003 | Sogard |
| 2003/0189180 | A1 | 10/2003 | Hamaguchi et al. |
| 2004/0079883 | A1 | 4/2004 | Sugiura et al. |
| 2004/0094726 | A1 | 5/2004 | Hashimoto |
| 2005/0279936 | A1 | 12/2005 | Litman et al. |
| 2006/0076489 | A1 | 4/2006 | Ohshima et al. |
| 2006/0169910 | A1 | 8/2006 | Frosien et al. |
| 2006/0289804 | A1 | 12/2006 | Knippelmeyer et al. |
| 2007/0057200 | A1 | 3/2007 | Fujita et al. |
| 2007/0145269 | A1 | 6/2007 | Buller et al. |
| 2007/0272856 | A1 | 11/2007 | Nijkerk et al. |
| 2008/0035861 | A1 | 2/2008 | Knowles et al. |
| 2008/0067376 | A1 | 3/2008 | Tanimoto et al. |
| 2008/0099693 | A1 | 5/2008 | Platzgummer |
| 2010/0133433 | A1 | 6/2010 | Tanimoto et al. |
| 2010/0224779 | A1 | 9/2010 | Indermuehle et al. |
| 2010/0276606 | A1 | 11/2010 | Baars et al. |
| 2011/0220795 | A1 | 9/2011 | Frosien |
| 2012/0153144 | A1 | 6/2012 | McMorran |
| 2013/0032713 | A1 | 2/2013 | Barbi et al. |
| 2014/0175279 | A1 | 6/2014 | Agemura |
| 2014/0361168 | A1 | 12/2014 | Ogawa et al. |
| 2015/0279615 | A1 | 10/2015 | Potocek et al. |
| 2016/0062249 | A1 | 3/2016 | Yamada et al. |
| 2016/0203947 | A1 | 7/2016 | Aoki et al. |
| 2016/0268096 | A1 | 9/2016 | Ren et al. |
| 2017/0122890 | A1 | 5/2017 | Inoue et al. |
| 2017/0154752 | A1 | 6/2017 | Esssers et al. |
| 2017/0169993 | A1 | 6/2017 | Iizuka |
| 2017/0178862 | A1 | 6/2017 | Ogasawara |
| 2017/0229279 | A1 | 8/2017 | Brodie et al. |
| 2017/0315069 | A1 | 11/2017 | Kikuiri |
| 2017/0315070 | A1 | 11/2017 | Kikuiri |
| 2017/0352140 | A1 | 12/2017 | Isomura |
| 2018/0286630 | A1 | 10/2018 | Takekoshi |
| 2018/0323034 | A1 | 11/2018 | Brodie |
| 2019/0096631 | A1 | 3/2019 | Takekoshi |
| 2019/0103252 | A1 | 4/2019 | Kakehi et al. |
| 2019/0180975 | A1 | 6/2019 | Shemesh et al. |
| 2019/0195621 | A1 | 6/2019 | Ogawa et al. |
| 2019/0378681 | A1 | 12/2019 | Stejskal et al. |
| 2019/0393013 | A1 | 12/2019 | Sed'a et al. |
| 2020/0090899 | A1 | 3/2020 | Mohammadi-Gheidari et al. |
| 2020/0194214 | A1 | 6/2020 | Van Veen et al. |
| 2021/0391139 | A1 | 12/2021 | Otten et al. |

FOREIGN PATENT DOCUMENTS

| | | |
|---|---|---|
| EP | 2702595 | 3/2014 |
| EP | 2715768 | 4/2014 |
| EP | 3971939 | 3/2022 |
| EP | 3971940 | 3/2022 |
| JP | S6142132 | 2/1986 |
| JP | S61025043 | 2/1986 |
| JP | S61042132 | 2/1986 |
| JP | 10073424 | 3/1998 |
| JP | H10062149 | 3/1998 |
| JP | H10062503 | 3/1998 |
| JP | 2006-510184 | 3/2006 |
| JP | 2008027965 | 2/2008 |
| JP | 2008-507690 | 3/2008 |
| JP | 2008066359 | 3/2008 |
| JP | 2009134926 | 6/2009 |
| JP | 2010519697 | 6/2010 |
| JP | 2011023126 | 2/2011 |
| JP | 2011258509 | 12/2011 |
| JP | 2012169091 | 9/2012 |
| JP | 2013128069 | 6/2013 |
| JP | 2014-238962 | 12/2014 |
| JP | 2017162590 | 9/2017 |
| JP | 2019186112 | 10/2019 |
| JP | 2020031156 | 2/2020 |
| WO | 2001-75951 | 10/2001 |
| WO | 2004081910 | 9/2004 |
| WO | 2012148267 | 11/2012 |
| WO | 2012165955 | 12/2012 |
| WO | 2014065663 | 5/2014 |
| WO | 2014188882 | 11/2014 |
| WO | 2017015483 | 1/2017 |
| WO | 2019064516 | 2/2019 |
| WO | 2019064503 | 4/2019 |
| WO | 2019064511 | 4/2019 |
| WO | 2019064519 | 4/2019 |
| WO | 2019158573 | 8/2019 |
| WO | 2019228922 | 12/2019 |
| WO | 2020040132 | 2/2020 |

OTHER PUBLICATIONS

International Search Report and Written Opinion issued in corresponding PCT Patent Application No. PCT/EP2020/087777, dated May 11, 2021.

Chen, Sheng-Yung, et al.: "In situ beam drift detection using a two-dimensional electron-beam position monitoring system for multiple-electron-beam-direct-write lithography", Journal of Vacuum Science and Technology, vol. 29, No. 4 (2011).

Taiwanese Office Action issued in corresponding Taiwanese Patent Application No. 109146794, dated Sep. 17, 2021.

Office Action issued in corresponding Japanese Patent Application No. 2022-539154, dated Feb. 2, 2024.

Office Action Issued in corresponding Japanese Patent Application No. 2022-539154, dated Jul. 14, 2023.

CHARGED PARTICLE ASSESSMENT TOOL, INSPECTION METHOD

CROSS-REFERENCE TO RELATED APPLICATIONS

This application is the U.S. national phase entry of PCT Patent Application No. PCT/EP2020/087777 which was filed on Dec. 23, 2020, which claims the benefit of priority of European Patent Application No. 20150394.3 which was filed on Jan. 6, 2020, of European Patent Application No. 20184160.8 which was filed Jul. 6, 2020, and of European Patent Application No. 20198201.4 which was filed on Sep. 24, 2020 and which are incorporated herein their entireties by reference.

FIELD

The embodiments provided herein generally relate to charged-particle assessment tools and inspection methods, and particularly to charged-particle assessment tools and inspection methods that use multiple sub-beams of charged particles.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

There is a general need to improve the throughput and other characteristics of charged particle inspection tools.

SUMMARY

It is an object of the present disclosure to provide embodiments that support improvement of throughput or other characteristics of charged-particle assessment tools.

According to a first aspect of the invention, there is provided a charged particle assessment tool comprising:

an objective lens configured to project a plurality of charged particle beams onto a sample, the objective lens defining a plurality of beam apertures through which respective ones of the charged particle beams can propagate toward the sample; and a plurality of sensor units adjacent respective ones of the beam apertures and configured to capture charged particles emitted from the sample.

According to a second aspect of the invention, there is provided a method of manufacturing an assessment tool, the method comprising:

forming a plurality of sensor units on, and a plurality of apertures in, a substrate; and attaching the substrate to an objective lens configured to project a plurality of charged particle beams onto a sample, so that the charged particle beams can be emitted through the apertures.

According to a third aspect of the invention, there is provided an inspection method comprising:

emitting a plurality of charged-particle beams through a plurality of beam apertures to a sample; and capturing charged particles emitted by the sample in response to the charged-particle beams using a plurality of sensor units provided adjacent respective ones of the beam apertures.

According to a fourth aspect of the invention, there is provided a multi-beam electron-optical system comprising a last electron-optical element in a multi-beam path of the multi-beam electron optical system, the last electron-optical element comprising a multi-manipulator array in which each array element is configured to manipulate at least one electron beam in the multi-beam path; and a detector configured and orientated to detect electrons emitted from a sample positioned in the multi-beam beam path, wherein the detector comprises a plurality of sensor units integrated into the multi-manipulator array and at least one sensor unit associated each array element.

According to a fourth aspect of the invention, there is provided a last electron-optical element for a multi-charged beam projection system configured to project a plurality of charged particle beams onto a sample, the last electron-optical element comprising:

an objective lens having an sample-facing surface defining a plurality of beam apertures through which respective ones of the charged particle beams can propagate toward the sample; and a plurality of sensor units adjacent respective ones of the beam apertures and configured to capture charged particles emitted from the sample.

Other advantages of the present invention will become apparent from the following description taken in conjunction with the accompanying drawings wherein are set forth, by way of illustration and example, certain embodiments of the present invention.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
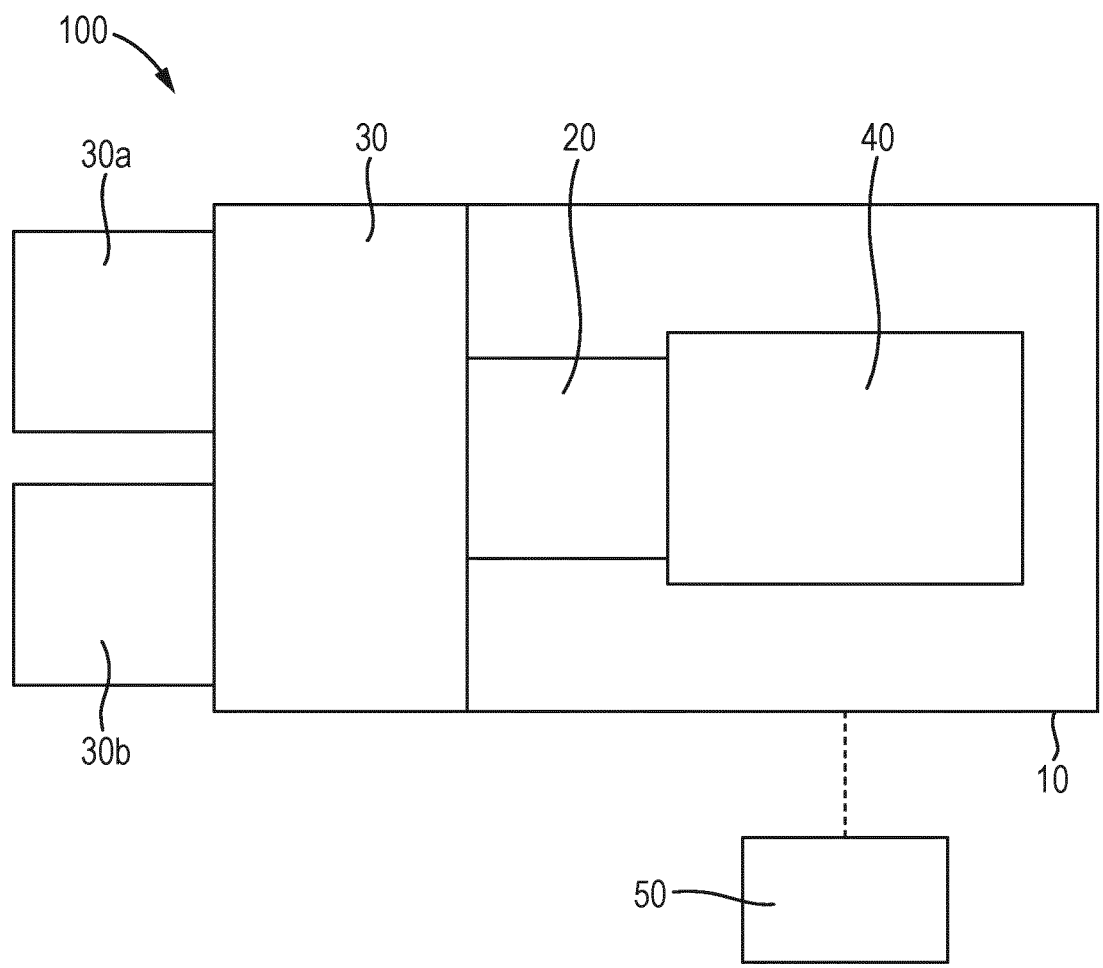
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than $\frac{1}{1000}$th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If an individual step has a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially if operator intervention is required for reviewing the defects. Thus, high throughput detection and identification of micro and nano-scale defects by inspection tools (such as a Scanning Electron Microscope ('SEM')) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

In a multi-beam inspection apparatus, the paths of some of the primary electron beams are displaced away from the central axis, i.e. a mid-point of the primary electron optical axis, of the scanning device. To ensure all the electron beams arrive at the sample surface with substantially the same angle of incidence, sub-beam paths with a greater radial distance from the central axis need to be manipulated to move through a greater angle than the sub-beam paths with paths closer to the central axis. This stronger manipulation may cause aberrations which result in blurry and out-of-focus images of the sample substrate. In particular, for sub-beam paths that are not on the central axis, the aberrations in the sub-beams may increase with the radial displacement from the central axis. Such aberrations may remain associated with the secondary electrons when they are detected. Such aberrations therefore degrade the quality of images that are created during inspection.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50. Electron beam tool 40 is located within main chamber 10.

EFEM 30 includes a first loading port 30a and a second loading port 30b. EFEM 30 may include additional loading port(s). First loading port 30a and second loading port 30b may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure in around the sample reaches a second pressure lower than the first pressure. After reaching the second pressure, the sample is transported to the electron beam tool by which it may be inspected. An electron beam tool 40 may comprise a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
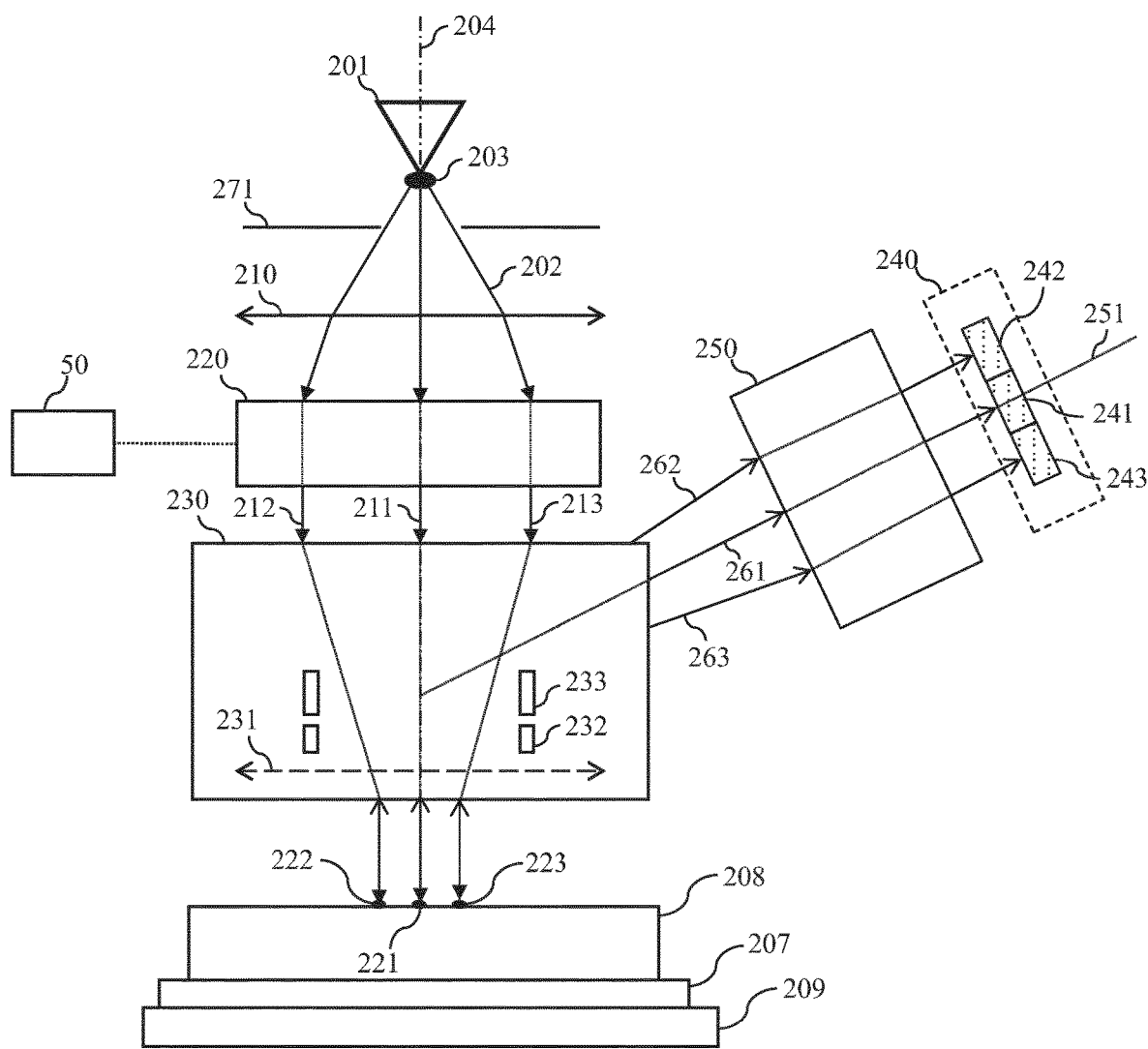
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a gun aperture plate 271, a condenser lens 210, a source conversion unit 220, a primary projection apparatus 230, a motorized stage 209, and a sample holder 207. The electron source 201, a gun aperture plate 271, a condenser lens 210, a source conversion unit 220 are the components of an illumination apparatus comprised by the multi-beam electron beam tool 40. The sample holder 207 is supported by motorized stage 209 so as to hold a sample 208 (e.g., a substrate or a mask) for inspection. Multi-beam electron beam tool 40 may further comprise a secondary projection apparatus 250 and an associated electron detection device 240. Primary projection apparatus 230 may comprise an objective lens 231, e.g. a unitary lens operating on the whole beam. An objective lens may be the last electron-optical element in the path of the multi-beam or in the electron-optical system; so the objective lens may be referred to as a type of last electron-optical element. Electron detection device 240 may comprise a plurality of detection elements 241, 242, and 243. A beam separator 233 and a deflection scanning unit 232 may be positioned inside primary projection apparatus 230.

The components that are used to generate a primary beam may be aligned with a primary electron-optical axis of the apparatus 40. These components can include: the electron source 201, gun aperture plate 271, condenser lens 210, source conversion unit 220, beam separator 233, deflection scanning unit 232, and primary projection apparatus 230. Secondary projection apparatus 250 and its associated electron detection device 240 may be aligned with a secondary electron-optical axis 251 of apparatus 40.

The primary electron-optical axis 204 is comprised by the electron-optical axis of the of the part of electron beam tool 40 that is the illumination apparatus. The secondary electron-optical axis 251 is the electron-optical axis of the of the part of electron beam tool 40 that is a detection apparatus. The primary electron-optical axis 204 may also be referred to herein as the primary optical axis (to aid ease of reference) or charged particle optical axis. The secondary electron-optical axis 251 may also be referred to herein as the secondary optical axis or the secondary charged particle optical axis.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202 that forms a primary beam crossover (virtual or real) 203. Primary electron beam 202 may be visualized as being emitted from primary beam crossover 203.

In this arrangement a primary electron beam, by the time it reaches the sample, and preferably before it reaches the projection apparatus, is a multi-beam. Such a multi-beam can be generated from the primary electron beam in a number of different ways. For example, the multi-beam may be generated by a multi-beam array located before the cross-over, a multi-beam array located in the source conversion unit 220, or a multi-beam array located at any point in between these locations. A multi-beam array may comprise a plurality of electron beam manipulating elements arranged in an array across the beam path. Each manipulating element may influence the primary electron beam to generate a sub-beam. Thus the multi-beam array interacts with an incident primary beam path to generate a multi-beam path down-beam of the multi-beam array.

Gun aperture plate 271, in operation, is configured to block off peripheral electrons of primary electron beam 202 to reduce Coulomb effect. The Coulomb effect may enlarge the size of each of probe spots 221, 222, and 223 of primary sub-beams 211, 212, 213, and therefore deteriorate inspection resolution. A gun aperture plate 271 may also be referred to as a coulomb aperture array.

Condenser lens 210 is configured to focus primary electron beam 202. Condenser lens 210 may be designed to focus primary electron beam 202 to become a parallel beam and be normally incident onto source conversion unit 220. Condenser lens 210 may be a movable condenser lens that may be configured so that the position of its first principle plane is movable. The movable condenser lens may be configured to be magnetic. Condenser lens 210 may be an anti-rotation condenser lens and/or it may be movable.

Source conversion unit 220 may comprise an image-forming element array, an aberration compensator array, a beam-limit aperture array, and a pre-bending micro-deflector array. The pre-bending micro-deflector array may deflect a plurality of primary sub-beams 211, 212, 213 of primary electron beam 202 to normally enter the beam-limit aperture array, the image-forming element array, and an aberration compensator array. In this arrangement, the image-forming element array may function as a multi-beam array to generate the plurality of sub-beams in the multi-beam path, i.e. primary sub-beams 211, 212, 213. The image forming array may comprise a plurality electron beam manipulators such as micro-deflectors or micro-lenses (or a combination of both) to influence the plurality of primary sub-beams 211, 212, 213 of primary electron beam 202 and to form a plurality of parallel images (virtual or real) of primary beam crossover 203, one for each of the primary sub-beams 211, 212, and 213. The aberration compensator array may comprise a field curvature compensator array (not shown) and an astigmatism compensator array (not shown). The field curvature compensator array may comprise a plurality of micro-lenses to compensate field curvature aberrations of the primary sub-beams 211, 212, and 213. The astigmatism compensator array may comprise a plurality of micro-stigmators to compensate astigmatism aberrations of the primary sub-beams 211, 212, and 213. The beam-limit aperture array may be configured to limit diameters of individual primary sub-beams 211, 212, and 213. FIG. 2 shows three primary sub-beams 211, 212, and 213 as an example, and it should be understood that source conversion unit 220 may be configured to form any number of primary sub-beams. Controller 50 may be connected to various parts of charged particle beam inspection apparatus 100 of FIG. 1, such as source conversion unit 220, electron detection device 240, primary projection apparatus 230, or motorized stage 209. As explained in further detail below, controller 50 may perform various image and signal processing functions. Controller 50 may also generate various control signals to govern operations of the charged particle beam inspection apparatus, including the charged particle multi-beam apparatus.

Condenser lens 210 may further be configured to adjust electric currents of primary sub-beams 211, 212, 213 down-beam of source conversion unit 220 by varying the focusing power of condenser lens 210. Alternatively, or additionally, the electric currents of the primary sub-beams 211, 212, 213 may be changed by altering the radial sizes of beam-limit apertures within the beam-limit aperture array corresponding to the individual primary sub-beams. The electric currents may be changed by both altering the radial sizes of beam-limit apertures and the focusing power of condenser lens 210. If the condenser lens is moveable and magnetic, off-axis sub-beams 212 and 213 may result that illuminate source conversion unit 220 with rotation angles. The rotation angles change with the focusing power or the position of the first principal plane of the movable condenser lens. A condenser lens 210 that is an anti-rotation condenser lens may be configured to keep the rotation angles unchanged while the focusing power of condenser lens 210 is changed. Such a condenser lens 210 that is also movable, may cause the rotation angles not change when the focusing power of the condenser lens 210 and the position of its first principal plane are varied.

Objective lens 231 may be configured to focus sub-beams 211, 212, and 213 onto a sample 208 for inspection and may form three probe spots 221, 222, and 223 on the surface of sample 208.

Beam separator 233 may be, for example, a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary sub-beams 211, 212, and 213. The electrostatic force is equal in magnitude but opposite in direction to the magnetic force exerted by magnetic dipole field of beam separator 233 on the individual electrons. Primary sub-beams 211, 212, and 213 may therefore pass at least substantially straight through beam separator 233 with at least substantially zero deflection angles.

Deflection scanning unit 232, in operation, is configured to deflect primary sub-beams 211, 212, and 213 to scan probe spots 221, 222, and 223 across individual scanning areas in a section of the surface of sample 208. In response to incidence of primary sub-beams 211, 212, and 213 or probe spots 221, 222, and 223 on sample 208, electrons are generated from the sample 208 which include secondary electrons and backscattered electrons. The secondary electrons propagate in three secondary electron beams 261, 262, and 263. The secondary electron beams 261, 262, and 263 typically have secondary electrons (having electron energy≤50 eV) and may also have at least some of the backscattered electrons (having electron energy between 50 eV and the landing energy of primary sub-beams 211, 212, and 213). The beam separator 233 is arranged to deflect the path of the secondary electron beams 261, 262, and 263 towards the secondary projection apparatus 250. The secondary projection apparatus 250 subsequently focuses the path of secondary electron beams 261, 262, and 263 onto a plurality of detection regions 241, 242, and 243 of electron detection device 240. The detection regions may be the separate detection elements 241, 242, and 243 that are arranged to detect corresponding secondary electron beams 261, 262, and 263. The detection regions generate corresponding signals which are sent to controller 50 or a signal processing system (not shown), e.g. to construct images of the corresponding scanned areas of sample 208.

The detection elements 241, 242, and 243 may detect the corresponding secondary electron beams 261, 262, and 263. On incidence of secondary electron beams with the detection elements 241, 242 and 243, the elements may generate corresponding intensity signal outputs (not shown). The outputs may be directed to an image processing system (e.g., controller 50). Each detection element 241, 242, and 243 may comprise one or more pixels. The intensity signal output of a detection element may be a sum of signals generated by all the pixels within the detection element.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control motorized stage 209 to move sample 208 during inspection of sample 208. The controller 50 may enable motorized stage 209 to move sample 208 in a direction, preferably continuously, for example at a constant speed, at least during sample inspection. The controller 50 may control movement of the motorized stage 209 so that it changes the speed of the movement of the sample 208 dependent on various parameters. For example, the controller may control the stage speed (including its direction) depending on the characteristics of the inspection steps of scanning process.

Although FIG. 2 shows that apparatus 40 uses three primary electron sub-beams, it is appreciated that apparatus 40 may use two or more number of primary electron sub-beams. The present disclosure does not limit the number of primary electron beams used in apparatus 40.

Figure 3:
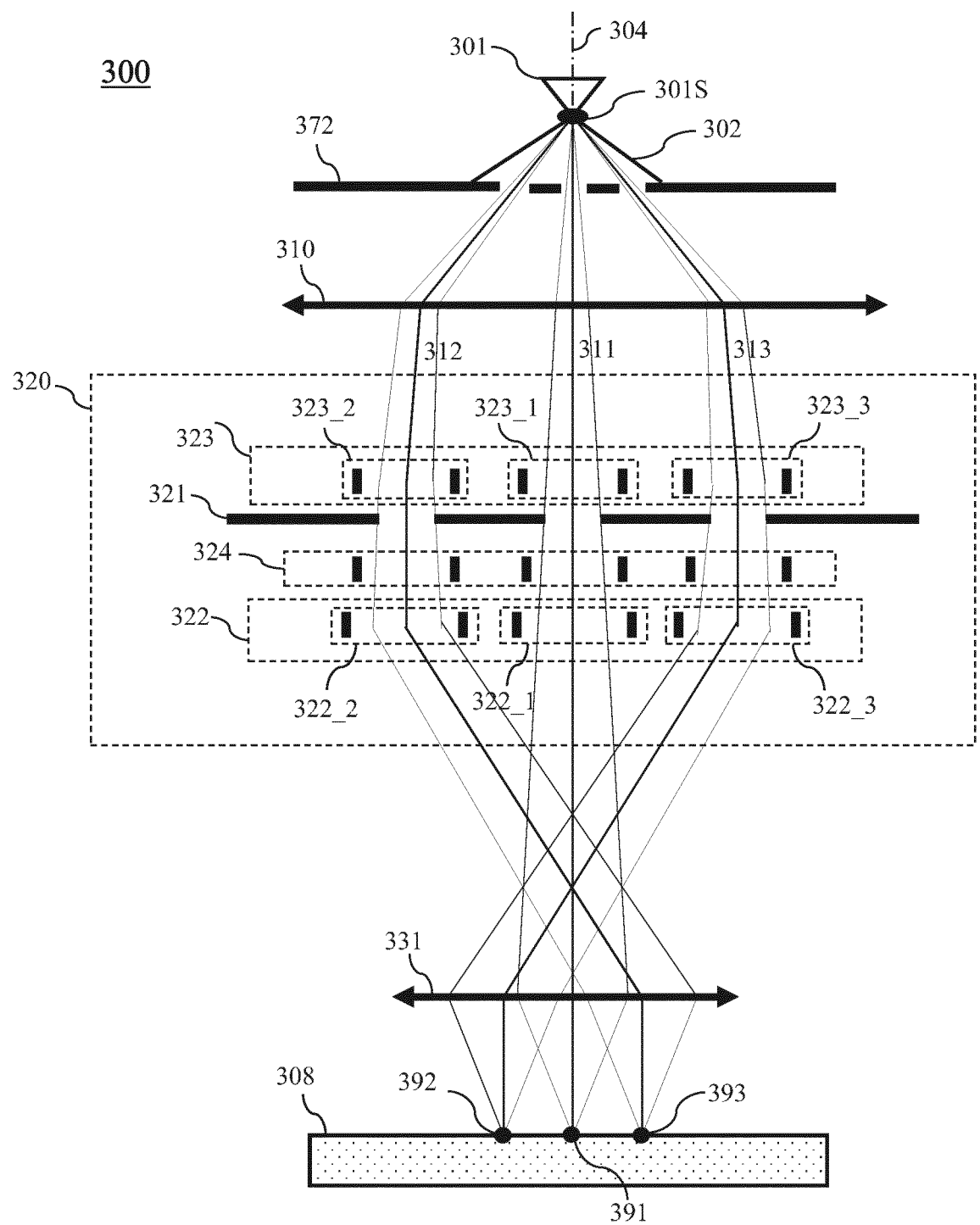
FIG. 3 is a schematic diagram of exemplary multi-beam apparatus illustrating an exemplary configuration of source conversion unit of the exemplary charged particle beam inspection apparatus of FIG. 1.

Reference is now made to FIG. 3, which is a schematic diagram of exemplary multi-beam apparatus illustrating an exemplary configuration of source conversion unit of the exemplary charged particle beam inspection apparatus of FIG. 1. The apparatus 300 may comprise an election source 301, a pre-sub-beam-forming aperture array 372, a condenser lens 310 (similar to condenser lens 210 of FIG. 2), a source conversion unit 320, an objective lens 331 (similar to objective lens 231 of FIG. 2), and a sample 308 (similar to sample 208 of FIG. 2). The election source 301, a pre-sub-beam-forming aperture array 372, a condenser lens 310 may be the components of an illumination apparatus comprised by the apparatus 300. The source conversion unit 320, an objective lens 331 may the components of a projection apparatus comprised by the apparatus 300. The source conversion unit 320 may be similar to source conversion unit 220 of FIG. 2 in which the image-forming element array of FIG. 2 is image-forming element array 322, the aberration compensator array of FIG. 2 is aberration compensator array 324, the beam-limit aperture array of FIG. 2 is beam-limit aperture array 321, and the pre-bending micro-deflector array of FIG. 2 is pre-bending micro-deflector array 323. The election source 301, the pre-sub-beam-forming aperture array 372, the condenser lens 310, the source conversion unit 320, and the objective lens 331 are aligned with a primary electron-optical axis 304 of the apparatus. The electron source 301 generates a primary-electron beam 302 generally along the primary electron-optical axis 304 and with a source crossover (virtual or real) 301S. The pre-sub-beam-forming aperture array 372 cuts the peripheral electrons of primary electron beam 302 to reduce a consequential Coulomb effect. The Coulomb effect is a source of aberration to the sub-beams due to interaction between electrons in different sub-beam paths. Primary-electron beam 302 may be trimmed into a specified number of sub-beams, such as three sub-beams 311, 312 and 313, by pre-sub-beam-forming aperture array 372 of a pre-sub-beam-forming mechanism. Although three sub-beams and their paths are referred to in the previous and following description, it should be understood that the description is intended to apply an apparatus, tool, or system with any number of sub-beams.

The source conversion unit 320 may include a sub-beam-limit aperture array 321 with beam-limit apertures configured to limit the sub-beams 311, 312, and 313 of the primary electron beam 302. The source conversion unit 320 may also include an image-forming element array 322 with image-forming micro-deflectors, 322_1, 322_2, and 322_3. There is a respective micro-deflector associated with the path of each sub-beam. The micro-deflectors 322_1, 322_2, and 322_3 are configured to deflect the paths of the sub-beams 311, 312, and 313 towards the electron-optical axis 304. The deflected sub-beams 311, 312 and 313 form virtual images of source crossover 301S. The virtual images are projected onto the sample 308 by the objective lens 331 and form probe spots thereon, which are the three probe spots, 391, 392, and 393. Each probe spot corresponds to the location of incidence of a sub-beam path on the sample surface. The source conversion unit 320 may further comprise an aberration compensator array 324 configured to compensate aberrations of each of the sub-beams. The aberrations in each sub-beam are typically present on the probe spots, 391, 392, and 393 that would be formed a sample surface. The aberration compensator array 324 may include a field curvature compensator array (not shown) with micro-lenses. The field curvature compensator and micro-lenses are configured to compensate the sub-beams for field curvature aberrations evident in the probe spots, 391, 392, and 393. The aberration compensator array 324 may include an astigmatism compensator array (not shown) with micro-stigmators. The micro-stigmators are controlled to operate on the sub-beams to compensate astigmatism aberrations that are otherwise present in the probe spots, 391, 392, and 393.

The source conversion unit 320 may further comprise a pre-bending micro-deflector array 323 with pre-bending micro-deflectors 323_1, 323_2, and 323_3 to bend the sub-beams 311, 312, and 313 respectively. The pre-bending micro-deflectors 323_1, 323_2, and 323_3 may bend the path of the sub-beams onto the beamlet-limit aperture array 321. The sub-beam path of the incident on beamlet-limit aperture array 321 may be orthogonal to the plane of orientation of the beamlet-limit aperture array 321. The condenser lens 310 may direct the path of the sub-beams onto the beamlet-limit aperture array 321. The condenser lens 310 may focus the three sub-beams 311, 312, and 313 to become parallel beams along primary electron-optical axis 304, so that it is perpendicularly incident onto source conversion unit 320, which may correspond to the beamlet-limit aperture array 321.

The image-forming element array 322, the aberration compensator array 324, and the pre-bending micro-deflector array 323 may comprise multiple layers of sub-beam manipulating devices, some of which may be in the form or arrays, for example: micro-deflectors, micro-lenses, or micro-stigmators.

In source the conversion unit 320, the sub-beams 311, 312 and 313 of the primary electron beam 302 are respectively deflected by the micro-deflectors 322_1, 322_2 and 322_3 of image-forming element array 322 towards the primary electron-optical axis 304. It should be understood that the sub-beam 311 path may already correspond to the electron-optical axis 304 prior to reaching micro-deflector 322_1, accordingly the sub-beam 311 path may not be deflected by micro-deflector 322_1.

The objective lens 331 focuses the sub-beams onto the surface of the sample 308, i.e., it projects the three virtual images onto the sample surface. The three images formed by three sub-beams 311 to 313 on the sample surface form three probe spots 391, 392 and 393 thereon. The deflection angles of sub-beams 311 to 313 are adjusted by the objective lens 311 to reduce the off-axis aberrations of three probe spots 391~393. The three deflected sub-beams consequently pass through or approach the front focal point of objective lens 331. As depicted the objective lens 331 is a magnetic lens that focuses all of the sub-beams. In an embodiment of the invention the objective lens is desirably an array of electrostatic lenses which may require the multibeam path to be directed by the source conversion unit 320, specifically for example the image-forming element array 322 featuring micro-deflectors, towards the array of electrostatic lenses in the objective lens 331. (For example each beam could be directed towards its own corresponding micro-lens in the array).

At least some of the above-described components in FIG. 2 and FIG. 3 may individually, or in combination with each other, be referred to as a manipulator array, multi-manipulator array, multi-manipulator or manipulator, because they manipulate one or more beams, or sub-beams, of charged particles.

Existing multi-e-beam defect inspection systems have resolution of about 2 to 10 nm at a throughput of 10 to 6000 mm$^2$ per hour. Such systems have a detector in a secondary column as discussed above. The architecture of existing multi-e-beam inspection tools has a detector remote from the source of electrons emitted from the sample such as back scattered and secondary electrons, which is not scalable for a many-beam system. It is also difficult to integrate a secondary column into a tool with an array objective lens, such as an electrostatic lens, (which is necessary to address coulomb interactions).

In an embodiment the objective lens referred to in earlier embodiments is an array objective lens. Typically such a lens arrangement is electrostatic. Each element in the array is a micro-lens operating a different beam or group of beams in the multi-beam. An electrostatic array objective lens has at least two plates each with a plurality of holes or apertures. The position of each hole in a plate corresponds to the position of a corresponding hole in the other plate. The corresponding holes operate in use on the same beam or group of beams in the multi-beam. A suitable example of a type of lens for each element in the array is an Einzel lens. The bottom electrode of objective lens is a CMOS chip detector integrated into a multi-beam manipulator array. Integration of a detector array into the objective lens removes the need for the secondary projection apparatus 250. The CMOS chip is preferably orientated to face a sample (because of the small distance (e.g. 100 µm) between wafer and bottom of the electron-optical system). In an embodiment, capture electrodes to capture the secondary electron signals are provided. The capture electrodes can be formed in the metal layer of, for example, a CMOS device. The capture electrode may form the bottom layer of the objective lens. The capture electrode may form the bottom surface in a CMOS chip. The CMOS chip may be a CMOS chip detector. The CMOS chip may be integrated into the sample facing surface of an objective lens assembly. The capture electrodes are examples of sensor units for detecting secondary electrons. The capture electrodes can be formed in other layers. Power and control signals of the CMOS may be connected to the CMOS by through-silicon vias. For robustness, preferably the bottom electrode consist of two elements: the CMOS chip and a passive Si plate with holes. The plate shields the CMOS from high E-fields.

Sensor units associated with bottom or sample facing surface of an objective lens are beneficial because the secondary and/or back-scatted electrons may be detected before the electrons encounter and become manipulated by an electron optical element of the electron-optical system. Beneficially the time taken for detection of such a sample emanating electron may be reduced preferably minimized.

In order to maximize the detection efficiency it is desirable to make the electrode surface as large as possible, so that substantially all the area of the array objective lens (excepting the apertures) is occupied by electrodes. Each electrode may have a diameter substantially equal to the array pitch. The electrode surfaces may substantially fill the sample-facing surface of the array objective lens. In an embodiment the outer shape of the electrode is a circle, but this can be made a square to maximize the detection area. Also the diameter of the through-substrate hole can be minimized Typical size of the electron beam is in the order of 5 to 15 micron.

Figure 5:
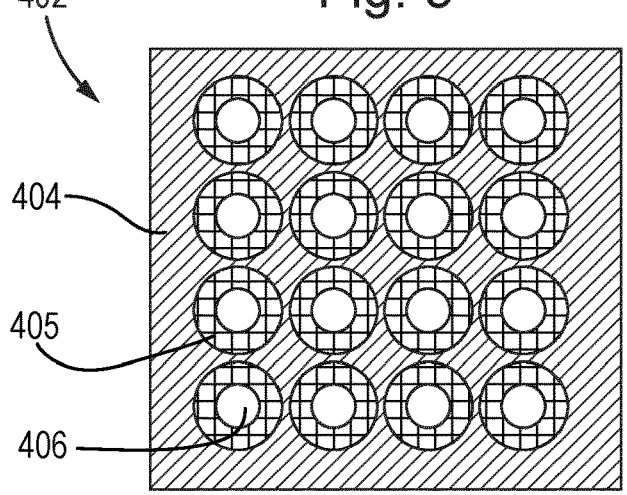
FIG. 5 is a bottom view of the objective lens of FIG. 4.
Figure 6:
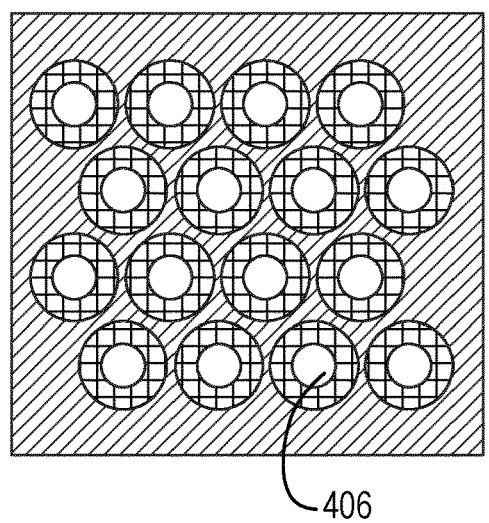
FIG. 6 is a bottom view of a modification of the objective lens of FIG. 4.

In an embodiment, a single capture electrode surrounds each aperture. The single capture electrode may have a circular perimeter and/or an outer diameter. The capture electrode may have an area extending between the aperture and the perimeter of the capture electrode. As depicted in FIGS. 5 and 6 the capture electrodes 405 may be arranged in rectangular array or a hexagonal array. In another embodiment, a plurality of electrode elements is provided around each aperture. The plurality of electrode elements may, together, have a circular perimeter and/or a diameter. The plurality of electrode elements may, together, have an area extending between the aperture and the perimeter of the plurality of electrode elements. The pluralities of electrode elements 405 may be arranged in rectangular array or a hexagonal array. The electrode elements are examples of sensor elements. The electrons captured by the electrode elements surrounding one aperture may be combined into a single signal or used to generate independent signals. The electrode elements may be divided radially. The electrode elements may form a plurality of concentric annuluses or rings. The electrode elements may be divided, angularly. The electrode elements may to form a plurality of sector-like pieces or segments. The segments may be of similar angular size and/or similar area. The electrode elements may be divided both radially and angularly or in any other convenient manner.

However a larger electrode surface leads to a larger parasitic capacitance, so a lower bandwidth. For this reason it may be desirable to limit the outer diameter of the electrode. Especially in case a larger electrode gives only a slightly larger detection efficiency, but a significantly larger capacitance. A circular (annular) electrode may provide a good compromise between collection efficiency and parasitic capacitance.

A larger outer diameter of the electrode may also lead to a larger crosstalk (sensitivity to the signal of a neighboring hole). This can also be a reason to make the electrode outer diameter smaller Especially in case a larger electrode gives only a slightly larger detection efficiency, but a significantly larger crosstalk.

The back-scattered and/or secondary electron current collected by electrode is amplified. The purpose of the amplifier is to enable sufficiently sensitive measurement of the current received or collected by the sensor unit to be measured and thus the number of back-scattered and/or secondary electrons. This can be measured by current measurements or the potential difference over a resistor. Several types of amplifier design may be used to amplify back-scattered and/or secondary electron current collected by electrode for example a Trans Impedance Amplifier. In such a Trans-Impedance Amplifier, the voltage output of the TIA is equal to the TIA resistance ($R_{TIA}$) multiplied by the measured current.

The larger $R_{TIA}$, the higher the amplification. However the bandwidth is determined by the RC time, which is equal to $R_{TIA}$ multiplied by the sum of the capacitances on the entrance side of the TIA.

A finite RC time has a similar effect as a larger electron optics spotsize, so it gives effectively a blur contribution in the deflection direction. Given the blur contribution budget of the detector and the deflection velocity the allowed RC time is determined. Given this RC time and the entrance capacitances $R_{TIA}$ is determined.

Based on the back-scattered and/or secondary electron current and $R_{TIA}$ the signal voltage is determined.

Noise contributions of the detector should be compared to the shot noise of the back-scattered and/or secondary electron current. Taking only the shot noise of the primary electron beam into account, the current noise per sqrt (Hz) due to shot noise is significantly larger than the voltage noise of a state of the art CMOS amplifier of typically ~1 nV/sqrt (Hz) as demonstrated below. The rough calculations set out below demonstrate that the proposed electrode is feasible from a noise point of view.

$$N_{PE\_def} = 5000 \tag{1}$$

$$I_{beam} = 1 \text{ nA} \tag{2}$$

$$d_{def} = 4 \text{ nm} \tag{3}$$

$$N_{pix\_defect} = 4 \tag{4}$$

$$blur_{rc} = 0.5 \text{ nm} \tag{5}$$

$$C_{detector} = \varepsilon_0 \cdot \zeta \cdot \frac{0.25 \cdot \pi \cdot (100 \text{ }\mu\text{m})^2}{1 \text{ }\mu\text{m}} = 2.086 \times 10^{-13} F \tag{6}$$

$$I_{sn\_noise} = \sqrt{2 \cdot Q_e \cdot I_{beam}} = 1.79 \times 10^{-14} \frac{A}{\sqrt{\text{Hz}}} \tag{7}$$

$$t_{defect} = \frac{N_{PE\_def} \cdot Q_e}{I_{beam}} = 0.801 \text{ }\mu\text{s} \tag{8}$$

$$l_{scan\_defect} := d_{def} \sqrt{N_{pix_{defect}}} = 8 \text{ nm} \tag{9}$$

$$v_{scan} = \frac{l_{scan\_defect}}{t_{defect}} = 9.986 \frac{\text{mm}}{\text{s}} \tag{10}$$

$$t_{RC} = \frac{blur_{RC}}{v_{scan}} = 50.069 \text{ ns} \tag{11}$$

$$R_{detector} = \frac{t_{RC}}{C_{detector}} = 2.4 \times 10^5 \Omega \tag{12}$$

$$V_{sn} = I_{sn\_noise} R_{detector} = 4.296 \frac{nV}{\sqrt{\text{Hz}}} \tag{13}$$

$$V_{sn} = \frac{\sqrt{2} Q_e^{3/2}}{\sqrt{I_{beam}}} \frac{blur_{RC} N_{PE\_def}}{C_{detector} d_{def} \sqrt{N_{pix\_defect}}} = 4.296 \frac{nV}{\sqrt{\text{Hz}}} \tag{14}$$

The above calculations can be explained as follows. It is assumed that the number of primary electrons required to detected a defect is 5000 (equation 1), the beam current is 1 nA (equation 2) the diameter of a defect is 4 nm (equation 3) and the number of pixels per defect is 4 (equation 4). We assume that a blur due to the finite RC time of the amplifier of 0.5 nm is acceptable (equation 5). The capacitance of the detector can be calculated from the geometry of the arrangement, for example, as indicated in equation 6 where 3 is the dielectric constant of the insulator underlying the capture electrode, 100 µm is the diameter of the capture electrode and 1 µm is the thickness of the insulator underneath the capture electrode. The intrinsic shot noise is calculated as in equation 7. The time to image one defect is calculated as in equation 8 where $Q_e$ is the electron charge. The length of a scan to detect a defect is calculated in equation 9 and the scanning velocity is calculated in equation 10. The RC time to be achieved is calculated in equation 11 and therefore the resistance of the detector is calculated in equation 12 and the resulting voltage noise in equation 13. Equation 14 combines the previous equations into a single equation to show dependencies. The typical voltage noise level that can be achieved in CMOS amplifiers is in the order of 1 nV/sqrt (Hz)—which this typical noise level of a CMOS amplifier. So it is plausible that the noise is dominated by the fundamental shot noise, and not by the voltage noise added by the CMOS amplifier. Because of this it is plausible that the proposed electrode is feasible from a noise point of view. That is a typical CMOS amplifier noise is sufficiently good to have a noise level that is small relative to the shot noise. (Even if it is large relative the shot noise, the arrangement could still work, but the effectiveness in terms of bandwidth or throughput (i.e. speed) could be reduced).

Figure 8:
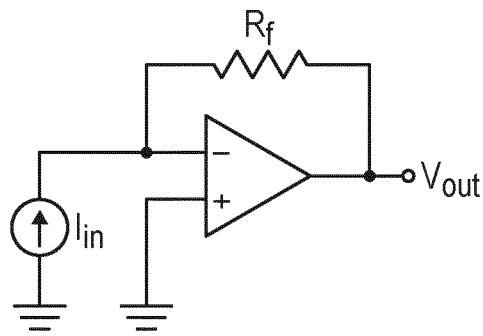
FIG. 8 is a schematic diagram of a theoretical trans impedance amplifier.
Figure 9:
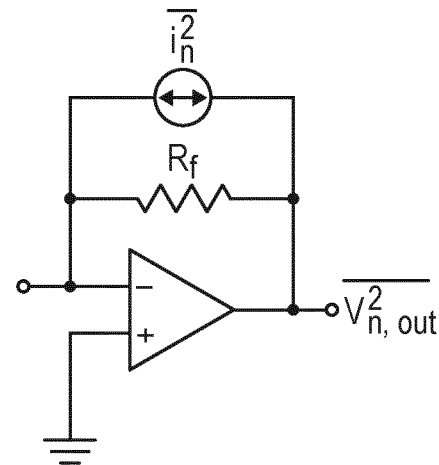
FIG. 9 is a schematic diagram of a trans impedance amplifier indicating the effect of thermal noise.

FIG. 8 is a schematic diagram of a theoretical trans impedance amplifier (TIA) in which the voltage output $V_{out}$ is simply the product of the measured current $I_{in}$ and the feedback resistance $R_f$. However, a real TIA has noise, in particular shot noise in the input $i_{sn}$ and thermal noise in the feedback resistor $i_n$ as depicted in FIG. 9. In most cases thermal noise dominates. The voltage noise at the output $v_n$ is given by:

$$v_n = \sqrt{4 \cdot k_b \cdot T \cdot R_f} \qquad (15)$$

where $k_b$ is the Boltzmann constant. The current noise at the entrance to the TIA is therefore:

$$i_n = \sqrt{\frac{4 \cdot k_b \cdot T}{R_f}} \qquad (16)$$

whereas the shot noise is given by:

$$i_{sn} = 2 \cdot Q_e \cdot I_{in} \qquad (17)$$

Therefore if the feedback resistance is increased, the thermal noise becomes lower relative to the shot noise of the input current (i.e. the back-scattered and/or secondary electron current).

It can be shown that the invention remains practical taking account of the effect of shot noise, by assuming that the number of electrons required to detect each defect is increased to 10,000; a blur budget of 2 nm is set; and the electrode diameter is reduced to 50 μm. In that case, the capacitance of the electrode becomes about 0.011 pF requiring a resistance of about $3.6 \times 10^7 \Omega$, resulting in a level of thermal noise about 20% greater than the shot noise. Therefore, various different arrangements of the proposed detector are feasible. The capacitance of the electrode can also be controlled by varying the thickness of an adjacent dielectric layer, which may be in the range of about 1 to about 5 μm.

Figure 4:
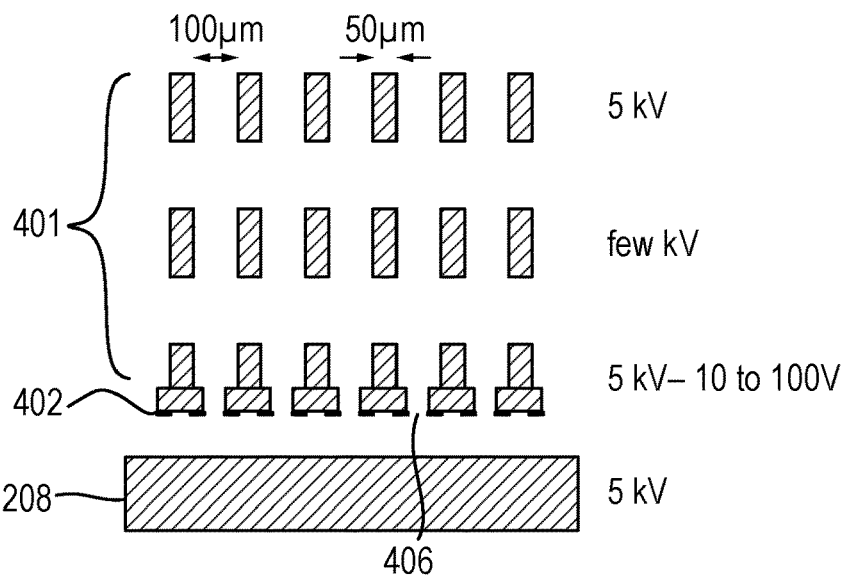
FIG. 4 is a schematic cross-sectional view of an objective lens of an inspection apparatus according to an embodiment.

An exemplary embodiment is shown in FIG. 4 which illustrates a multibeam objective lens 401 in schematic cross section. On the output side of the objective lens 401, the side facing the sample 208, a detector module 402 is provided. FIG. 5 is a bottom view of detector module 402 which comprises a substrate 404 on which are provided a plurality of capture electrodes 405 each surrounding a beam aperture 406. Beam apertures 406 are large enough not to block any of the primary electron beams. Capture electrodes 405 can be considered as examples of sensor units which receive back-scattered or secondary electrodes and generate a detection signal, in this case an electric current. The beam apertures 406 may be formed by etching through substrate 404. In the arrangement shown in FIG. 5, the beam apertures 406 are shown in a rectangular array. The beam apertures 406 can also be differently arranged, e.g. in a hexagonal close packed array as depicted in FIG. 6.

Figure 7:
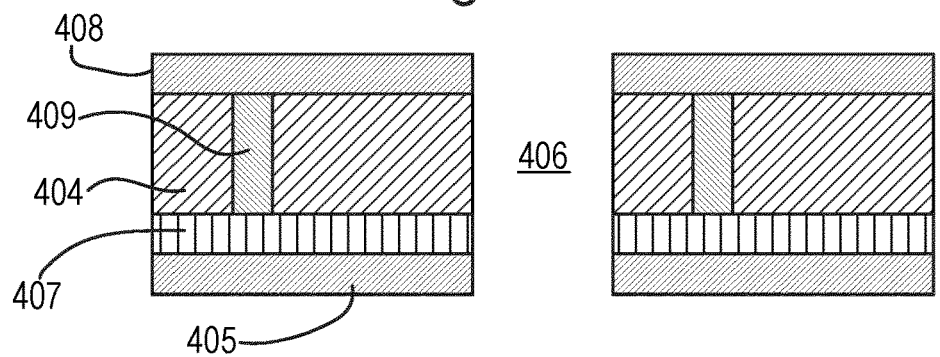
FIG. 7 is an enlarged schematic cross-sectional view of a detector incorporated in the objective lens of FIG. 4.

FIG. 7 depicts at a larger scale a part of the detector module 402 in cross section. Capture electrodes 405 form the bottommost, i.e. most close to the sample, surface of the detector module 402. Between the capture electrodes 405 and the main body of the silicon substrate 404 a logic layer 407 is provided. Logic layer 407 may include amplifiers, e.g. Trans Impedance Amplifiers, analogue to digital converters, and readout logic. In an embodiment, there is one amplifier and one analogue to digital converter per capture electrode 405. Logic layer 407 and capture electrodes 405 can be manufactured using a CMOS process with the capture electrodes 405 forming the final metallisation layer.

A wiring layer 408 is provided on the backside of substrate 404 and connected to the logic layer 407 by through-silicon vias 409. The number of through-silicon vias 409 need not be the same as the number of beam apertures 406.

In particular if the electrode signals are digitized in the logic layer 407 only a small number of through-silicon vias may be required to provide a data bus. Wiring layer 408 can include control lines, data lines and power lines. It will be noted that in spite of the beam apertures 406 there is ample space for all necessary connections. The detection module 402 can also be fabricated using bipolar or other manufacturing techniques. A printed circuit board and/or other semiconductor chips may be provided on the backside of detector module 402.

FIG. 4 depicts a three electrode objective lens but it will be appreciated that any other form of objective lens, e.g. a two electrode lens, may also be used.

Figure 10:
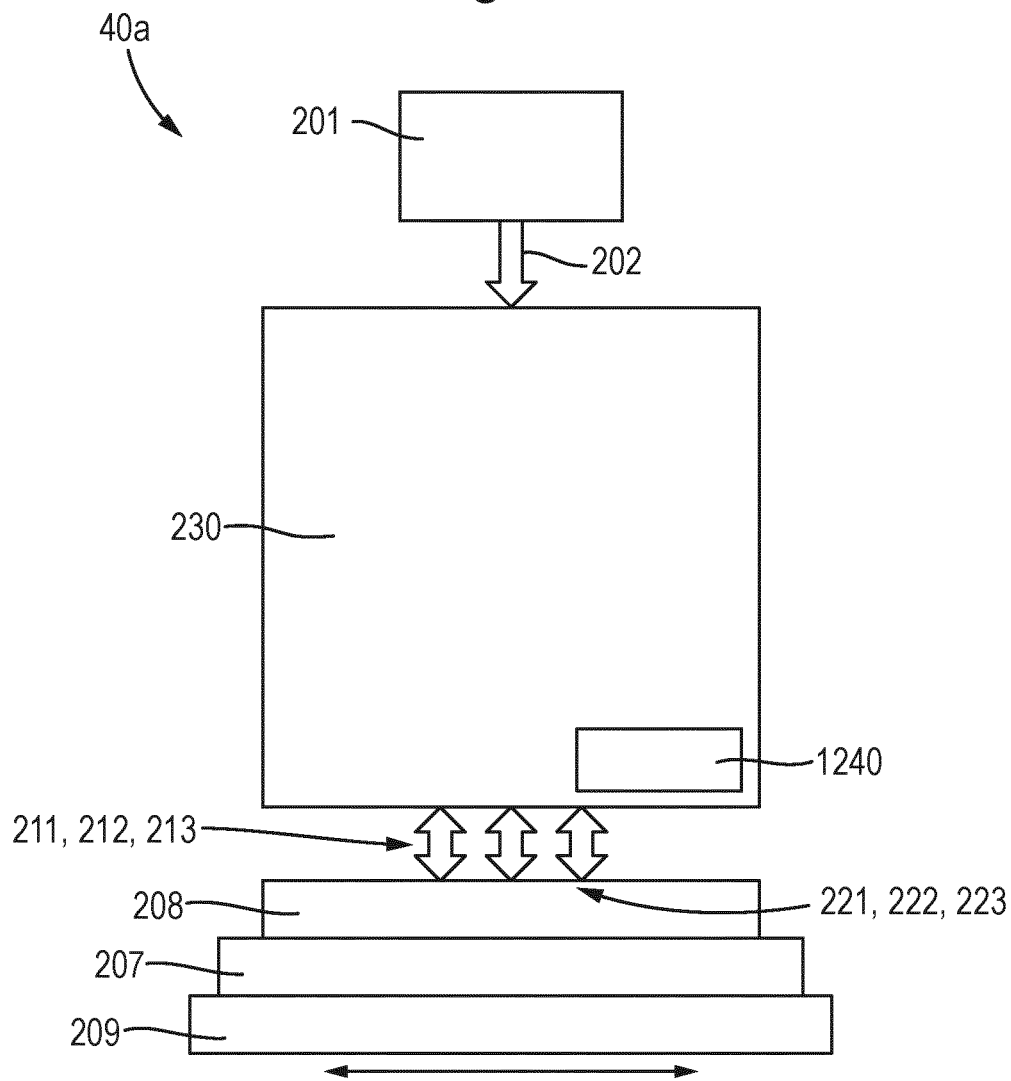
FIG. 10 is a schematic diagram illustrating another exemplary multi-beam apparatus that may be part of the exemplary charged particle beam inspection apparatus of FIG. 1.

Reference is now made to FIG. 10, which is a schematic diagram illustrating another exemplary electron beam tool 40a that may be part of the exemplary charged particle beam inspection apparatus 100 of FIG. 1 in place of the tool 40 of FIG. 2. Parts of the apparatus 40a that have similar functions as corresponding parts of the apparatus 40 of FIG. 2 are identified with the same references. A reduced or simplified description of such parts is included below in some cases.

Multi-beam electron beam tool 40a (also referred to herein as apparatus 40a) comprises an electron source 201, a projection apparatus 230, a motorized stage 209, and a sample holder 207. The electron source 201 and projection apparatus 230 may together be referred to as an illumination apparatus. The sample holder 207 is supported by motorized stage 209 so as to hold a sample 208 (e.g., a substrate or a mask) for inspection. Multi-beam electron beam tool 40a further comprises an electron detection device 1240. (Note this may be different in structure from the electron detection device 240 in the secondary electron-optical column of the embodiments referred in reference with FIGS. 2 and 3, although it has the same function: to detect electrons from the sample).

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202.

Projection apparatus 230 is configured to convert primary electron beam 202 into a plurality of sub-beams 211, 212, 213 and to direct each sub-beam onto the sample 208. Although three sub-beams are illustrated for simplicity, there may be many tens, many hundreds or many thousands of sub-beams. The sub-beams may be referred to as beamlets.

Controller 50 of FIG. 1 may be connected to various parts of electron beam tool 40a such as electron source 201, electron detection device 1240, projection apparatus 230, and motorized stage 209. Controller 50 may perform various image and signal processing functions. Controller 50 may also generate various control signals to govern operations of the charged particle beam inspection apparatus, including the charged particle multi-beam apparatus.

Projection apparatus 230 may be configured to focus sub-beams 211, 212, and 213 onto a sample 208 for inspection and may form three probe spots 221, 222, and 223 on the surface of sample 208. Projection apparatus 230 may be configured to deflect primary sub-beams 211, 212, and 213 to scan probe spots 221, 222, and 223 across individual scanning areas in a section of the surface of sample 208. In response to incidence of primary sub-beams 211, 212, and 213 on probe spots 221, 222, and 223 on sample 208, electrons are generated from the sample 208 which include secondary electrons and backscattered electrons. The secondary electrons typically have electron energy≤50 eV and backscattered electrons typically have electron energy between 50 eV and the landing energy of primary sub-beams 211, 212, and 213.

Electron detection device 1240 is configured to detect secondary electrons and/or backscattered electrons and to generate corresponding signals which are sent to a controller or a signal processing system (not shown), e.g. to construct images of the corresponding scanned areas of sample 208. Electron detection device 1240 may comprise a detector module 402 integrated with an objective lens 401 as described above with reference to FIGS. 4 to 7.

Figure 11:
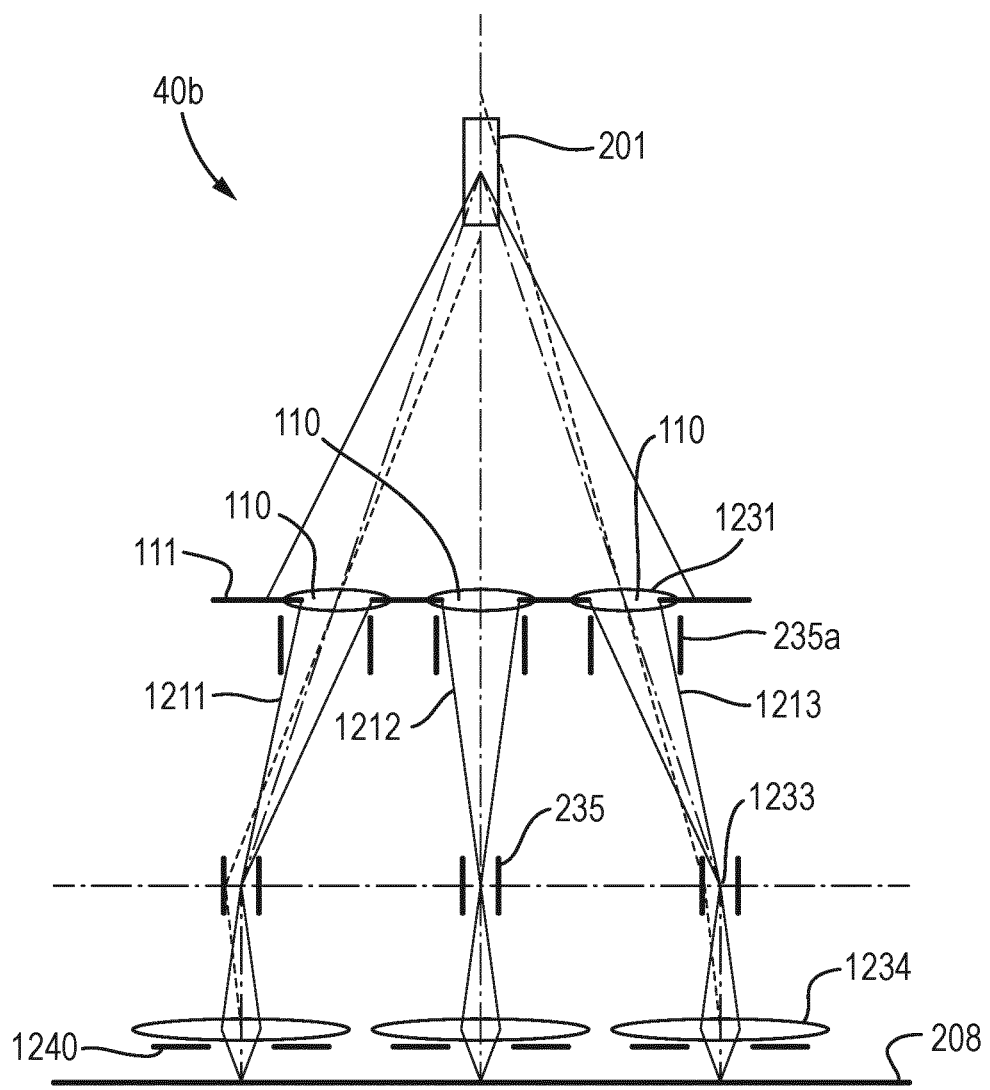
FIG. 11 is a schematic diagram illustrating another exemplary multi-beam apparatus according to an embodiment.

FIG. 11 is a schematic diagram illustrating another exemplary electron beam tool 40b that may be part of the exemplary charged particle beam inspection apparatus 100 of FIG. 1 in place of the tool 40 of FIG. 2. Parts of the apparatus 40a that have similar functions as corresponding parts of the apparatus 40 of FIG. 2 are identified with the same references. A reduced or simplified description of such parts is included below in some cases.

Electron source 201 directs electrons toward an array of condenser lenses 1231 forming part of projection system 230. The electron source is desirably a high brightness thermal field emitter with a good compromise between brightness and total emission current. There may be many tens, many hundreds or many thousands of condenser lenses 1231. Condenser lenses 1231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The array of condenser lenses may take the form of at least two plates, acting as electrodes, with an aperture in each plate aligned with each other and corresponding to the location of a sub-beam. At least two of the plates are maintained during operation at different potentials to achieve the desired lensing effect.

In an arrangement the array of condenser lenses is formed of three plate arrays in which charged particles have the same energy as they enter and leave each lens, which arrangement may be referred to as an Einzel lens. The beam energy is the same on entering as leaving the Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect.

The array of condenser lenses may comprise a plurality of beam apertures 110. The beam apertures 110 may be formed, for example, by openings in a substantially planar beam aperture body 111. The beam apertures 110 divide a beam of charged particles from source 201 into a corresponding plurality of sub-beams Each condenser lens in the array directs electrons into a respective sub-beam 1211, 1212, 1213 which is focused at a respective intermediate focus 1233. At the intermediate focuses 1233 are deflectors 235. Deflectors 235 are configured to bend a respective sub-beam 1211, 1212, 1213 by an amount effective to ensure that the principal ray (which may also be referred to as the beam axis) is incident on the sample 208 substantially normally (i.e. at substantially 90° to the nominal surface of the sample). Deflectors 235 may also be referred to as collimators. Downbeam (i.e. closer to the sample) of the intermediate focuses 1233 are a plurality of objective lenses 1234, each of which directs a respective sub-beam 1211, 1212, 1213 onto the sample 208. Objective lenses 1234 can be configured to demagnify the electron beam by a factor greater than 10, desirably in the range of 50 to 100 or more.

An electron detection device 1240 is provided between the objective lenses 1234 and the sample 208 to detect secondary and/or backscattered electrons emitted from the sample 208. Electron detection device 1240 may comprise a detector module 402 integrated with an objective lens 401 as described above with reference to FIGS. 4 to 7. The electron detection device 1240 may comprise sensor units for example capture electrodes 402.

The system of FIG. 11 can be configured to control the landing energy of the electrons on the sample. The landing energy can be selected to increase emission and detection of secondary electrons dependent on the nature of the sample being assessed. A controller provided to control the objective lenses 1234 may be configured to control the landing energy to any desired value within a predetermined range or to a desired one of a plurality of predetermined values. In an embodiment, the landing energy can be controlled to desired value in the range of from 1000 eV to 5000 eV. Details of electrode structures and potentials that can be used to control landing energy are disclosed in EPA 20158804.3, which document is incorporated herein by reference.

In some embodiments, the charged particle assessment tool further comprises one or more aberration correctors that reduce one or more aberrations in the sub-beams. In an embodiment, each of at least a subset of the aberration correctors is positioned in, or directly adjacent to, a respective one of the intermediate foci (e.g. in or adjacent to the intermediate image plane). The sub-beams have a smallest sectional area in or near a focal plane such as the intermediate plane. This provides more space for aberration correctors than is available elsewhere, i.e. upbeam (closer to the source) or downbeam (closer to the sample) of the intermediate plane (or than would be available in alternative arrangements that do not have an intermediate image plane).

In an embodiment, aberration correctors positioned in, or directly adjacent to, the intermediate foci (or intermediate image plane) comprise deflectors to correct for the source 201 appearing to be at different positions for different beams. Correctors can be used to correct macroscopic aberrations resulting from the source that prevent a good alignment between each sub-beam and a corresponding objective lens.

The aberration correctors may correct aberrations that prevent a proper column alignment. Such aberrations may also lead to a misalignment between the sub-beams and the correctors. For this reason, it may be desirable to additionally or alternatively position aberration correctors at or near the condenser lenses 1231 (e.g. with each such aberration corrector being integrated with, or directly adjacent to, one or more of the condenser lenses 1231). This is desirable because at or near the condenser lenses 1231 aberrations will not yet have led to a shift of corresponding sub-beams because the condenser lenses 1231 are vertically close or coincident with the beam apertures. A challenge with positioning correctors at or near the condenser lenses 231, however, is that the sub-beams each have relatively large sectional areas and relatively small pitch at this location, relative to locations further downbeam. The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference.

In some embodiments, each of at least a subset of the aberration correctors is integrated with, or directly adjacent to, one or more of the objective lenses 1234. In an embodiment, these aberration correctors reduce one or more of the following: field curvature; focus error; and astigmatism. Additionally or alternatively, one or more scanning deflectors (not shown) may be integrated with, or directly adjacent to, one or more of the objective lenses 1234 for scanning the sub-beams 1211, 1212, 1213 over the sample 208. In an embodiment, the scanning deflectors described in US 2010/0276606, which document is hereby incorporated by reference in its entirety, may be used.

In an embodiment the objective lens referred to in earlier embodiments is an array objective lens. Each element in the array is a micro-lens operating a different beam or group of beams in the multi-beam. An electrostatic array objective lens has at least two plates each with a plurality of holes or apertures. The position of each hole in a plate corresponds to the position of a corresponding hole in the other plate. The corresponding holes operate in use on the same beam or group of beams in the multi-beam. A suitable example of a type of lens for each element in the array is a two electrode decelerating lens.

An electron detection device 1240 is provided between the objective lenses 1234 and the sample 208 to detect secondary and/or backscattered electrons emitted from the sample 208. Electron detection device may comprise a detector module 402 integrated with an objective lens 401 as described above with reference to FIGS. 4 to 7. The electron detection device 240 may comprise sensor units for example capture electrodes 405.

In an embodiment of the invention, the correctors 235 at the intermediate focuses 1233 are embodied by a slit deflector 300. Slit deflector 300 is an example of a manipulator and may also be referred to as a slit corrector.

Figure 12:
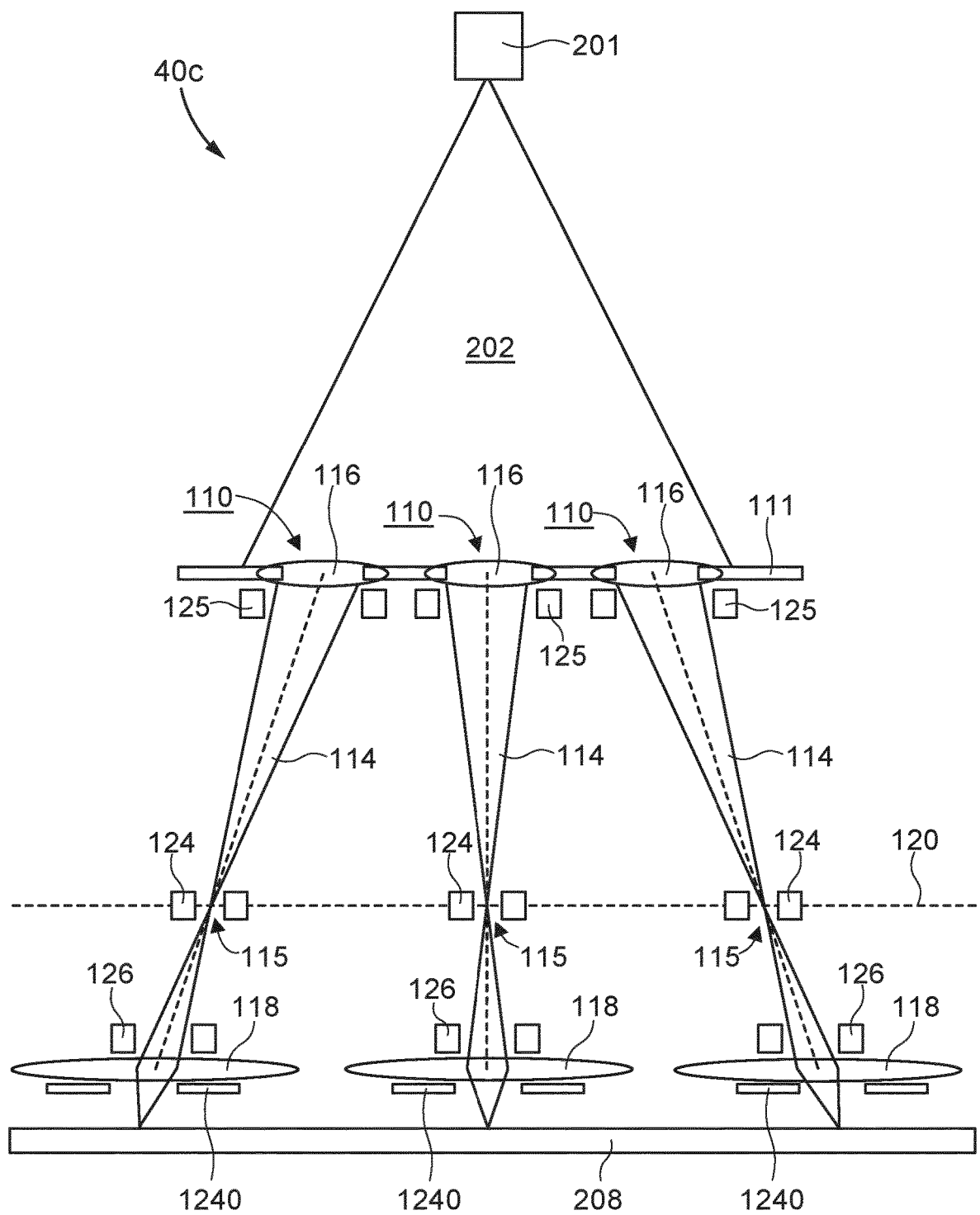
FIG. 12 is a schematic diagram of another exemplary multi-beam apparatus according to an embodiment.

Another exemplary electron beam tool 40c, that may be part of the exemplary charged particle beam inspection apparatus 100 of FIG. 1 in place of the tool 40 of FIG. 2, is illustrated schematically in FIG. 12. Parts of the apparatus 40a that have similar functions as corresponding parts of the apparatus 40 of FIG. 2 are identified with the same references. A reduced or simplified description of such parts is included below in some cases.

The tool 40c further comprises one or more aberration correctors 124, 125, 126 that reduce one or more aberrations in the sub-beams 114. In an embodiment, each of at least a subset of the aberration correctors 124 is positioned in, or directly adjacent to, a respective one of the intermediate foci 115 (e.g. in or adjacent to the intermediate image plane 120). The sub-beams 114 have a smallest cross-sectional area in or near a focal plane such as the intermediate plane 120. This provides more space for aberration correctors 124 than is available elsewhere, i.e. upbeam or downbeam of the intermediate plane 120 (or than would be available in alternative arrangements that do not have an intermediate image plane 120).

In an embodiment, aberration correctors 124 positioned in, or directly adjacent to, the intermediate foci 115 (or intermediate image plane 120) comprise deflectors to correct for the source 201 appearing to be at different positions for different sub-beams 114 derived from beam 112 emitted from source 201. Correctors 124 can be used to correct macroscopic aberrations resulting from the source 201 that prevent a good alignment between each sub-beam 114 and a corresponding objective lens 118.

The aberration correctors 124 may correct aberrations that prevent a proper column alignment. Such aberrations may also lead to a misalignment between the sub-beams 114 and the correctors 124. For this reason, it may be desirable to additionally or alternatively position aberration correctors 125 at or near the condenser lenses 116 (e.g. with each such aberration corrector 125 being integrated with, or directly adjacent to, one or more of the condenser lenses 116). This is desirable because at or near the condenser lenses 116 aberrations will not yet have led to a shift of corresponding sub-beams 114 because the condenser lenses 116 are vertically close or coincident with the beam apertures 110. A challenge with positioning correctors 125 at or near the condenser lenses 116, however, is that the sub-beams 114 each have relatively large cross-sectional areas and relatively small pitch at this location, relative to locations further downstream.

In some embodiments, as exemplified in FIG. 12, each of at least a subset of the aberration correctors 126 is integrated with, or directly adjacent to, one or more of the objective lenses 118. In an embodiment, these aberration correctors 126 reduce one or more of the following: field curvature; focus error; and astigmatism. In the apparatus of FIG. 12, any or all of the correctors 124, 125, 126 can be slit deflectors.

Figure 13:
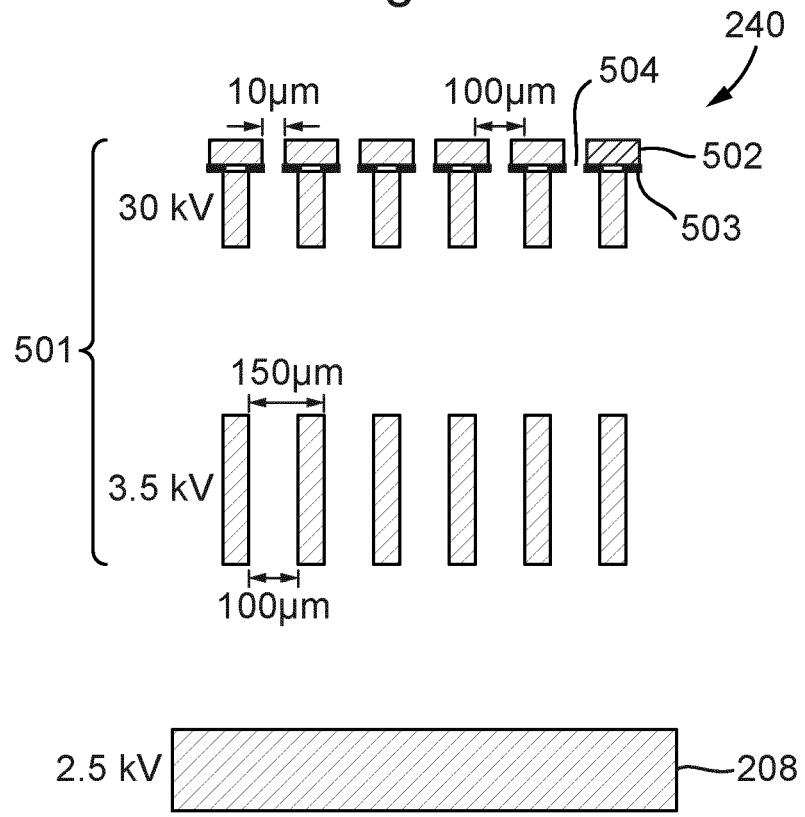
FIG. 13 is a schematic cross-sectional view of an objective lens of an inspection apparatus according to an embodiment.
Figure 14:
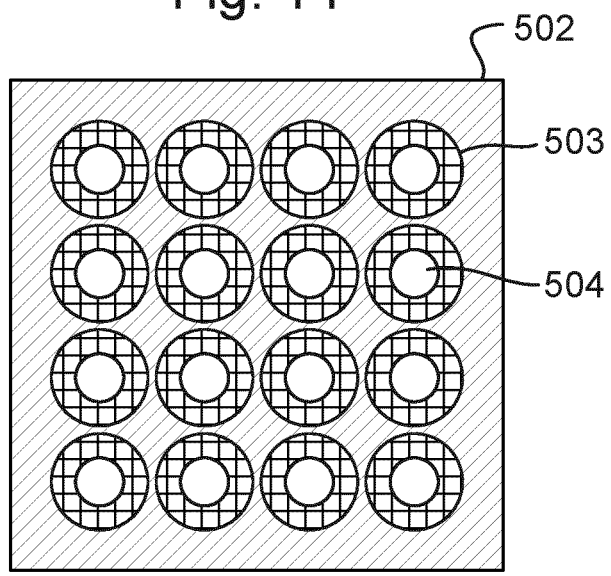
FIG. 14 is a bottom view of a detector unit incorporated in the objective lens of FIG. 13.

FIGS. 13 and 14 depict another example of an electron detection device 240 that can be used in an embodiment of the invention, for example it can be incorporated in the electron beam tools 40, 40a, 40b, 40c described above with reference for example to FIGS. 2, 10, 11 and 12. FIG. 13 is a schematic side view of electron detection device 240 integrated in or associated with the objective lens array 501 and FIG. 14 is a view from below of electron detection device 240.

As shown in FIG. 13, electron detection device 240 in this example comprises a substrate 502 provided with a plurality of sensor units 503 surrounding respective beam apertures 504. Substrate 502 is mounted to the upper electrode (further from sample 208) of a decelerating array objective lens 501. The sensor units 503 face toward the sample 208. The sensor units may be positioned with the sensing surfaces located between the upbeam and downbeam facing surfaces of the upper electrode. The sensor units 503 may be integrated into or associated with the electrode of the objective lens 501 furthest from the sample 208. This is in contrast to the electron detection device 240 of FIG. 7 which is integrated into, or associated with, the lower electrode of an array objective lens. That is in both embodiments the sensor units may be integrated into the objective lens 501. (The sensor unit 503 of the FIG. 7 may be mounted to, but not necessarily integrated with an electrode of an array objective lens furthest from the source, or closest to the sample.) FIG. 13 depicts a two electrode objective lens but it will be appreciated that any other form of objective lens, e.g. a three electrode lens, may also be used.

The electron detection device 240 in this example is placed away from the electrode of the objective lens 501 furthest from the source, in other words away from an upbeam electrode of the objective lens 501. In this position, an electrode in the objective lens 501 is closer to the sample, or down-beam, of the electron detection device 240. Thus the secondary electrons emitted by the sample 208 are accelerated by down beam positioned electrode array of the objective lens 501, for example to many kV (perhaps about 28.5 kV). The substrate supporting the sensor units 503 during operation may be held at the same potential difference as the upper electrode. As a result the sensor units 503 can comprise, for example, PIN detectors and/or scintillators. This has the advantage that no significant additional noise sources are present as PIN detectors and scintillators have a large initial amplification of the signal. Another advantage of this arrangement is that it is easier to access the electron detection device 240, e.g. for making power and signal connections or for servicing in use. Sensor units having capture electrodes could be used at this location instead, but this could result in poorer performance.

A PIN detector comprises a reverse-biased PIN diode and has an intrinsic (very lightly doped) semiconductor region sandwiched between a p-doped and an n-doped region. Secondary electrons incident on the intrinsic semiconductor region generate electron-hole pairs and allow a current to flow, generating a detection signal.

A scintillator comprises a material that emits light when electrons are incident on it. A detection signal is generated by imaging the scintillator with a camera or other imaging device.

In order to correctly image secondary electrodes on the sensor units 503 it is desirable to provide a relatively large potential difference between last electrode and the sample 208. For example the upper electrode of the objective lens may be at about 30 kV, the lower electrode at about 3.5 kV and the sample 208 at about 2.5 kV. A large potential difference between the lower electrode and the sample 208 may increase aberrations of the objective lens on the primary beam but a suitable trade-off can be selected.

Exact dimensions of an embodiment may be determined on a case-by-case basis. The diameter of the beam apertures 504 may be in the range of about 5 to 20 μm, e.g. about 10 μm. The width of the slits in the electrodes may be in the range of from 50 to 200 μm, e.g. about 100 μm. The pitch of the beam apertures and the electrode slits may be in the range of from 100 to 200 μm, e.g. about 150 μm. The gap between upper and lower electrodes may be in the range of from about 1 and 1.5 mm, e.g. about 1.2 mm. The depth of the lower electrode may be in the range of from about 0.3 to 0.6 mm, e.g. about 0.48 mm. The working distance between the lower electrode and the sample 208 may be in the range of form about 0.2 to 0.5 mm, e.g. about 0.37 mm Desirably the electric field strength between the lower electrode and the sample 208 is no more than about 2.7 kV/mm in order to avoid or reduce damage to the sample 208. The field in the gap between upper and lower electrodes can be larger, e.g. over 20 kV/mm.

The beam apertures 504 associated with the sensor units have smaller diameters than the electrode arrays to increase the surface of the sensor units available to capture electrodes emanating from the sample. However the dimensions of the beam aperture diameters are selected so that they permit passage of the sub-beams; that is the beam apertures are not beam limiting. The beam apertures are design to permit passage of the sub-beams without shaping their cross-section. The same comment applies to the beam apertures 406 associated with the sensor units 402 of the embodiment depicted in FIGS. 4 to 7.

In an embodiment, a single sensor unit (e.g. PIN detector) surrounds each aperture. The single sensor unit may have a circular perimeter and/or an outer diameter. The sensor unit may have an area extending between the aperture and the perimeter of the sensor unit. The sensor units 503 may be arranged in rectangular array or a hexagonal array. In another embodiment, a plurality of sensor elements (e.g. smaller PIN detectors) is provided around each aperture. The plurality of sensor elements may, together, have a circular perimeter and/or a diameter. The plurality of sensor elements may, together, have an area extending between the aperture and the perimeter of the plurality of sensor elements. The pluralities of sensor elements may be arranged in rectangular array or a hexagonal array. The signal generated from electrons captured by sensor elements surrounding one aperture may be combined into a single signal or used to generate independent signals. The sensor elements may be divided radially. The sensor elements may form a plurality of concentric annuluses or rings. The sensor elements may be divided, angularly. The sensor elements may to form a plurality of sector-like pieces or segments. The segments may be of similar angular size and/or similar area. The sensor elements may be divided both radially and angularly or in any other convenient manner. The surfaces of the sensor units, optionally their sensor elements, may substantially fill the surface of the substrate supporting the sensor units.

Figure 15:
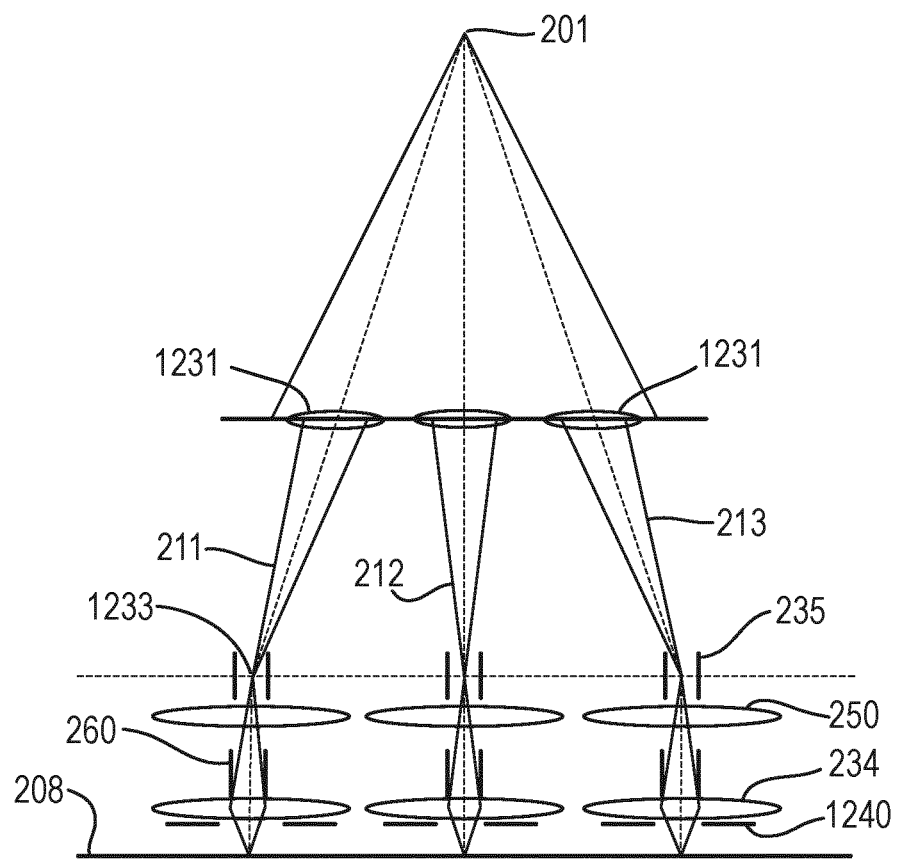
FIG. 15 is a schematic diagram illustrating another exemplary multi-beam apparatus according to an embodiment.

FIG. 15 is a schematic diagram of an assessment tool. Parts that are common to earlier embodiments are indicated with the same reference numeral and not described further below. Points of difference are described.

Each condenser lens in the array 1231 directs electrons into a respective sub-beam 211, 212, 213 which is focused at a respective intermediate focus 1233. Deflectors 235 are provided at the intermediate focuses 1233.

Below (i.e. downbeam or further from source 201) deflectors 235 there is a control lens array 250 comprising a control lens 251 for each sub-beam 211, 21, 213. Control lens array 250 may comprise at least two, for example three, plate electrode arrays connected to respective potential sources. A function of control lens array 250 is optimize the beam opening angle with respect to the demagnification of the beam and/or to control the beam energy delivered to the objective lenses 234, each of which directs a respective sub-beam 211, 212, 213 onto the sample 208. The control lenses pre-focus the sub-beams (e.g. apply a focusing action to the sub-beams prior to the sub-beams reaching the objective lens array 241). The pre-focusing may reduce divergence of the sub-beams or increase a rate of convergence of the sub-beams. The control lens array and the objective lens array operate together to provide a combined focal length. Combined operation without an intermediate focus may reduce the risk of aberrations. Note that the reference to demagnification and opening angle is intended to refer to variation of the same parameter. In an ideal arrangement the product of demagnification and the corresponding opening angle is constant over a range of values. However, the opening angle may be influenced by the use of an aperture. (It should be noted that in the arrangement shown in FIG. 15 adjustment of magnification results in similar adjustment of the opening angle because the beam current remains consistent along the beam path.)

The provision of a control lens array 250 in addition to an objective lens array 241 provides additional degrees of freedom for controlling properties of the sub-beams as described in EP Application No. 20196716.3 filed 17 Sep. 2020, of which the portions referring use and control of the control lens are hereby incorporated by reference. The additional freedom is provided even when the control lens array 250 and objective lens array 241 are provided relatively close together, for example such that no intermediate focus is formed between the control lens array 250 and the objective lens array 241. If there are two electrodes then the demagnification and landing energy are controlled together. If there are three or more electrodes the demagnification and landing energy can be controlled independently. The control lenses may thus be configured to adjust the demagnification and/or beam opening angle of respective sub-beams (e.g. using the electric power source to apply suitable respective potentials to the electrodes of the control lenses and the objective lenses). This optimization can be achieved with having an excessively negative impact on the number of objective lenses and without excessively deteriorating aberrations of the objective lenses (e.g. without increasing the strength of the objective lenses).

Optionally an array of scan deflectors 260 is provided between the control lens array 250 and the array of objective lenses 234. The array of scan deflectors 260 comprises a scan deflector 261 for each sub-beam 211, 212, 213. Each scan deflector is configured to deflect a respective sub-beam 211, 212, 213 in one or two directions so as to scan the sub beam across the sample 208 in one or two directions.

An electron detection device 1240 is provided between the objective lenses 234 and the sample 208 to detect secondary and/or backscattered electrons emitted from the sample 208. An exemplary construction of the electron detection system is described below.

The system of FIG. 15 is configured to control the landing energy of the electrons on the sample by varying the potentials applied to the electrodes of the control lenses and the objective lenses. The control lenses and objective lenses work together and may be referred to as an objective lens assembly. The landing energy can be selected to increase emission and detection of secondary electrons dependent on the nature of the sample being assessed. A controller may be configured to control the landing energy to any desired value within a predetermined range or to a desired one of a plurality of predetermined values. In an embodiment, the landing energy can be controlled to desired value in the range of from 1000 eV to 5000 eV.

Desirably, the landing energy is primarily varied by controlling the energy of the electrons exiting the control lens. The potential differences within the objective lenses are preferably kept constant during this variation so that the electric field within the objective lens remains as high as possible. The potentials applied to the control lens in addition may be used to optimize the beam opening angle and demagnification. The control lens can also be referred to as a refocus lens as it can function to correct the focus position in view of changes in the landing energy. The use of the control lens array enables the objective lens array to be operated at its optimal electric field strength.

In some embodiments, the charged particle assessment tool further comprises one or more aberration correctors that reduce one or more aberrations in the sub-beams as discussed above.

In an embodiment, aberration correctors are positioned in, or directly adjacent to, the intermediate foci (or intermediate image plane) as described above.

In some embodiments, the detector 1240 of the objective lens assembly comprises a detector array down-beam of at least one electrode of the objective lens array 241. In an embodiment, the detector 1240 is adjacent to and/or integrated with the objective lens array 241. For example, the detector array may be implemented by integrating a CMOS chip detector into a bottom electrode of the objective lens array.

In a variation on the embodiment of FIG. 15, the condenser lens array 1231 and collimators 235 are omitted, as disclosed in European Patent Application No. 20196714.8 filed on 17 Sep. 2020 which is incorporated by reference at least in so far as the disclosure of such electron-optical architecture. Such an arrangement may feature a source 201, a collimator (which may be a macro-collimator lens or a collimator lens array), a scan deflector (which may be a macro-scan deflector or a scan deflector array), a control lens, an objective lens array and a detector array. The arrangement features a beam shaping limiter (or beam shaping limiting array) and may feature an upper beam limiter. The source 201 emits electrons toward a upper beam limiter, which defines an array of beam-limiting apertures. The upper beam limiter may be referred to as an upper beam-limiting aperture array or up-beam beam-limiting aperture array. The upper beam limiter may comprise a plate (which may be a plate-like body) having a plurality of apertures. The upper beam limiter forms sub-beams from a beam of charged particles emitted by the source 201. The upper beam limiter may be associated with the control lens array and may form the most-upbeam electrode of the control lens array. Portions of the beam other than those contributing to forming the sub-beams may be blocked (e.g. absorbed) by the upper beam limiter, for example, so as not to interfere with the sub-beams down-beam. The collimator array (e.g. formed using MEMS manufacturing techniques) collimates the individual sub-beams, and may direct the sub-beams to the control lenses. In this variation, optionally the upper beam limiter, collimator element array, control lenses 250, scan deflector array 260, objective lenses 234, beam shaping limiter and detector module 1240 can all be formed using MEMS manufacturing techniques.

The beam shaping limiter is associated with the objective lenses and shapes the sub-beams down-beam of the control lenses. The scan deflector scans the sub-beams defined upbeam of the beam-shaping limiter over the beam shaping limiter. The beam shaping limiter shapes the sub-beams that are incidental on the sample surface. Use of the beam shaping limiter may reduce, if not minimize, the aberrations contributed by the control lenses. As the beam shaping limiter is down beam of the control lens array, the apertures in the beam shaping limiter adjust the beam current along the beam path. Thus control of the magnification by the control lens operates differently on the opening angle. That is the apertures in the beam shaping limiter break the direct correspondence between variations in the magnification and opening angle In a tool having a variable landing energy, such as that described above with reference to FIG. 15, the Z position (i.e. position along the beam path) of the focus changes with landing energy. The main reason for this is that the focal length of the objective lens is roughly equal to 4 times the landing energy divided by the electrostatic field in the objective lens. In order to improve the aberration level of the objective lens it is desired to keep the electrostatic field as high as possible. As a result the focal length scales proportional to the landing energy. It is possible to reduce the electrostatic field in the objective lens if the Z position of the focus is too close to the objective lens but this results in a loss of resolution. Conventionally, the sample is moved in the Z direction to make sure the primary beams are correctly focused on the wafer. In one arrangement, the Z position of the focus can vary up to 1 mm for a change of landing energy between 500V and 5 kV and as a result the measurement signal, which is dependent on distance between sample and detector, varies substantially. The relationship between change in landing energy and change in Z position of the focus depends in part on the lens strength of the objective lens so in other arrangements the range of variation in the Z position of the focus may be greater or less than 1 mm. There may be a linear relationship between landing energy and focal distance. In the above range of landing energies, the resolution can substantively be maintained.

According to an embodiment it is proposed to maintain the position of the detector relative to the sample, even if the sample is moved relative to the objective lens due to a change in focus position, e.g. as a result of a change in landing energy. For example, the distance between sample and detector is maintained in the range of about 50 to 100 µm. In an embodiment, the distance between the objective lens and the sample may be about 250 µm or more. However there is a lower limit to the proximity in which the objective lens may be positioned relative to a sample and thus the proximity of the focus of the sub-beams to the objective lens. In such a situation there is a risk that the objective lens electrode might need to be too thin to be easily manufacturable. A detector used with such an arrangement might need to be too thin to be easily manufacturable. The desirable distance between sample and detector may depend on the detector size (specifically the electrode diameter) and/or the detector pitch. All other things being equal, a larger detector and/or a larger detector pitch may allow a larger distance between sample and detector. An embodiment of the invention can therefore maintain a high secondary electron detection at a given beam pitch and detector diameter.

Figure 16:
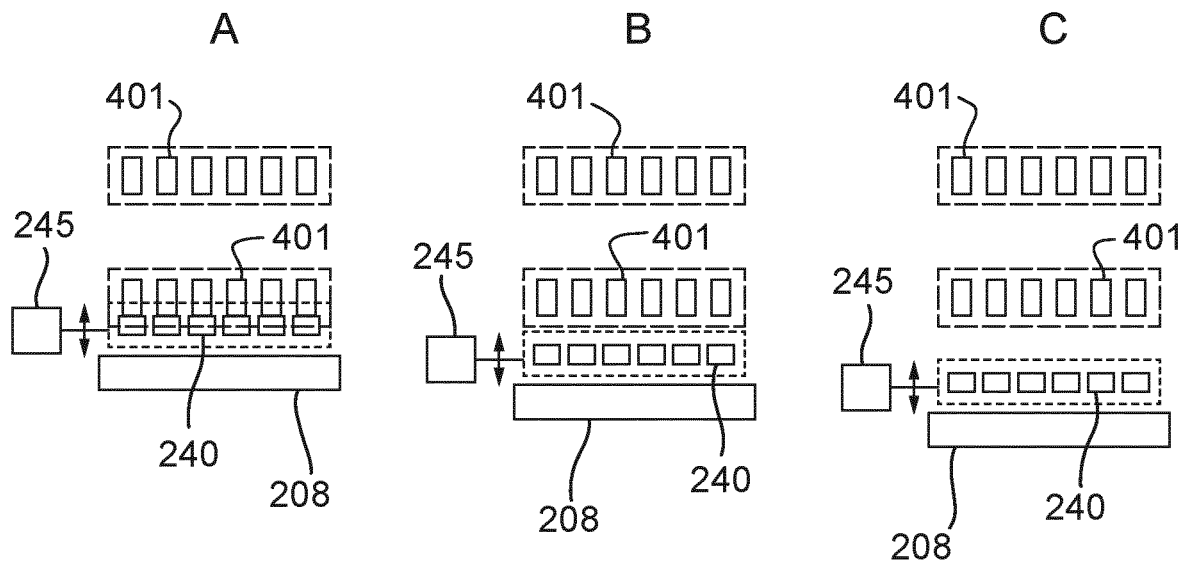
FIG. 16 is an enlarged schematic cross-sectional view of a detector incorporated in the objective lens of the apparatus of FIG. 15 with the detector in different positions.

Two approaches to maintaining constant the distance between sample and detector are proposed. As depicted in FIG. 16, the detector module 240 is connected to an actuator system 245 which is configured to position the detector module 245 in the direction parallel to the direction of propagation of the electron beams, i.e. perpendicular to the surface of the sample. Within FIG. 16, A, B and C show the arrangement with the detector in different vertical positions. The actuation system 245 can be connected to the overall control system 50 so as to maintain the detection module 245 at a constant distance from the sample. That is even as the sample is moved to position its surface at a focal position that changes, e.g. due to changes in the landing energy of the electron beams. It may not be necessary to maintain the distance between detector module 240 and sample 208 exactly constant. Rather it can be sufficient to reduce the variation in distance to an acceptable level. Actuation system 245 may include various different types of actuators, e.g. piezo-electric actuators and Lorenz actuators. One actuator may be sufficient to position all sensor units of a detector module or multiple actuators may be used, each positioning a group of sensor units. It is also possible to have one or more actuators per sensor unit. As the detectors may be in an array on a substrate the actuator arrangement may actuate the substrate. Desirably an actuator is able to reposition the detector module in a matter of seconds or less.

As well as positioning the detector in Z, the actuator system 245 may be configured to position the detector in other degrees of freedom, such as Rx and Ry. However providing actuation in additional degrees of freedom may undesirably increase complexity.

Figure 17:
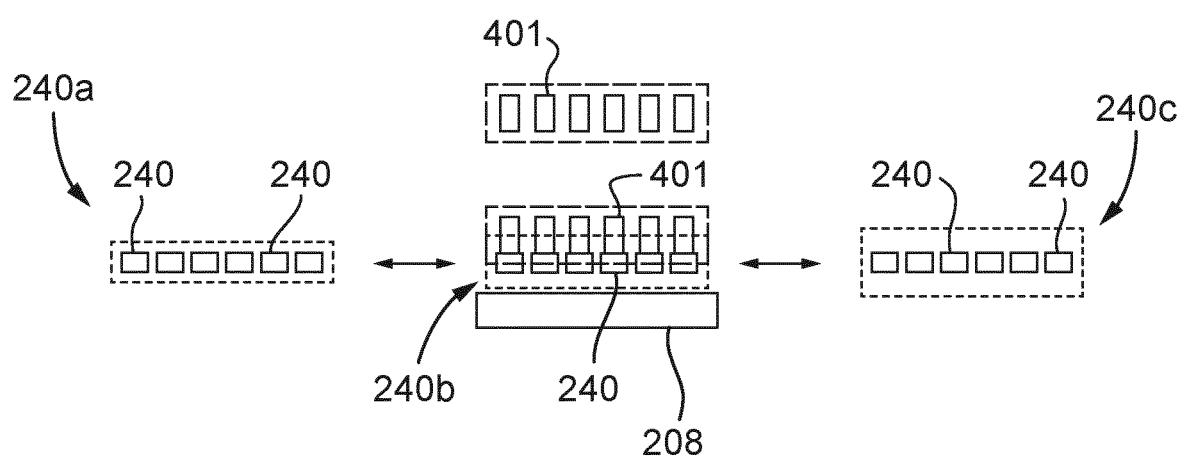
FIG. 17 is an enlarged schematic cross-sectional view of an alternative detector that can be used in the objective lens of the apparatus of FIG. 15

In another approach, the detector is exchangeable. In an embodiment depicted in FIG. 17, two or more, e.g. three or four or five, detector modules that are interchangeable. Each interchangeable detector module 240a, 240b, 240c, is configured to have the charged-particle receiving surfaces of its sensor units at a different vertical position relative to objective lenses 401. For example each detector module 240a, 240b, 240c may be formed on a substrate of different dimensions, e.g. thickness. Alternatively or in addition, spacers of different thicknesses may be provided. Such a spacer may be used to space the detector relative to the objective lens array. Detector modules may be interchangeable on their own or in combination with other elements such as the objective lens assembly, the objective lens array, beam shaping limiter, upper limiting array, collimator array, scan deflector array and/or control lens array. The different electron-optical components may have their own designated modules. They may be comprised with other electron-optical components in the same module so that there are fewer modules than the number of exchangeable electron-optical component. Alternatively all exchangeable electron-optical components, preferably the MEMS elements, for example of the objective lens assembly may be in an exchangeable module. In an arrangement a module may comprise an actuator for example to actuate the detector array relative to other electron-optical components in the module. Spacers used to space the electron-optical components may be exchangeable. Spacers may be incorporated in a module with multiple electron components, between the electron-optical components.

Desirably, an automated interchange mechanism is provided so that a module, such as the detector module, can be swapped between operable and non-operable positions without opening the tool, e.g. in between assessments of successive samples or batches of samples. Alternatively, a module, such as the detector module, may be manually interchangeable, e.g. field replaceable. A field replaceable module may be removed and replaced with the same or different module while maintaining the vacuum in which the electron-optical tool 40 is located as described in U.S. Application Ser. No. 63/037,481 filed on 10 Jun. 2020 which is incorporated by reference at least in so far as the features enabling a replaceable module is hereby incorporated by reference. Only a section of the column corresponding to the module to be replaced is vented for the module to be removed and returned or replaced. Although this is less desirable than an automated interchange mechanism since opening the tool increases downtime, it may still be beneficial where long runs of measurements at the same beam settings are to be performed. If an automated interchange device is provided the exchange of modules may take of the order of minutes whereas a manual exchange may take of the order of hours. Actuating an electron-optical component, such as the detector, may be quicker than either an automated interchange of modules or a manual exchange, taking a matter of seconds. The vertical position of the detector module may also be controlled by use of an interchangeable spacer which may be interchangeable by an automated or manually operated arrangement as described with respect to the electron-optical module. The interchangeable spacer may be incorporated in an exchangeable module.

An assessment tool according to an embodiment of the invention may be a tool which makes a qualitative assessment of a sample (e.g. pass/fail), one which makes a quantitative measurement (e.g. the size of a feature) of a sample or which generates an image of map of a sample. Examples of assessment tools are inspections tools and metrology tools.

The following clauses are exemplary embodiments of the invention:

Clause 1: A charged particle assessment tool comprising: an objective lens configured to project a plurality of charged particle beams onto a sample, the objective lens having an sample-facing surface defining a plurality of beam apertures through which respective ones of the charged particle beams are emitted toward the sample; and a plurality of capture electrodes adjacent respective ones of the beam apertures and configured to capture charged particles emitted from the sample.

Clause 2: A tool according to clause 1 wherein each capture electrode is configured to substantially surround a respective beam aperture.

Clause 3: A tool according to clause 1 or 2 wherein the capture electrodes are configured to substantially fill the sample-facing surface.

Clause 4: A tool according to clause 1 or 2 wherein the capture electrodes have a circular outer perimeter.

Clause 5: A tool according to anyone of the preceding clauses further comprising a substrate mounted on the sample-facing surface of the objective lens and on which the capture electrodes are formed.

Clause 6: A tool according to clause 5 further comprising control circuitry formed in the substrate.

Clause 7: A tool according to clause 6 wherein the control circuitry comprises one or more of: an amplifier, e.g. a trans-impedance amplifier; an analog-to-digital converter; a data multiplexor; read-out gates.

Clause 8: A tool according to clause 7 wherein the control circuitry comprises one amplifier for each capture electrode.

Clause 9: A tool according to any one of clauses 5 to 8 further comprising conductive traces provided on the other side of the substrate to the capture electrodes.

Clause 10: A tool according to any one of clauses 5 to 9 further comprising vias passing though the substrate.

Clause 11: A tool according to any one of clauses 5 to 10 wherein the substrate is formed of silicon Clause 12: A tool according to any one of the preceding clauses wherein the capture electrodes are formed by a CMOS process.

Clause 13: A tool according to any one of the preceding clauses wherein each capture electrode comprises a plurality of electrode elements.

Clause 14: A method of manufacturing an assessment tool, the method comprising: forming a plurality of capture electrodes on, and a plurality of apertures in, a substrate; and attaching the substrate to an objective lens configured to project a plurality of charged particle beams onto a sample, so that the charged particle beams can be emitted through the apertures.

Clause 15: A method according to clause 14 wherein the apertures are formed by etching through the substrate.

Clause 16: An inspection method comprising: emitting a plurality of charged-particle beams through a plurality of beam apertures to a sample; and capturing charged particles emitted by the sample in response to the charged-particle beams using a plurality of capture electrodes provided adjacent respective ones of the beam apertures.

Clause 17: A multi-beam electron-optical system comprising a last electron-optical element in a multi-beam path of the multi-beam electron optical system, the last electron-optical element comprising—a multi-manipulator array in which each array element is configured to manipulate at least one electron beam in the multi-beam path; and—a detector configured and orientated to detect electrons emitted from a sample positioned in the multi-beam beam path, wherein the detector comprises a plurality of electrodes integrated into the multi-manipulator array and at least one electrode associated each array element.

Clause 18: A last electron-optical element for a multi-charged beam projection system configured to project a plurality of charged particle beams onto a sample, the last electron-optical element comprising: an objective lens having an sample-facing surface defining a plurality of beam apertures through which respective ones of the charged particle beams are emitted toward the sample; and a plurality of capture electrodes adjacent respective ones of the beam apertures and configured to capture charged particles emitted from the sample.

Clause 19: A charged particle assessment tool comprising: an objective lens configured to project a plurality of charged particle beams onto a sample, the objective lens defining a plurality of beam apertures through which respective ones of the charged particle beams can propagate toward the sample; and a plurality of sensor units adjacent respective ones of the beam apertures and configured to capture charged particles emitted from the sample.

Clause 20: A tool according to clause 19 wherein each sensor unit is configured to substantially surround a respective beam aperture.

Clause 21: A tool according to clause 19 or 20 wherein the sensor units have a circular outer perimeter.

Clause 22: A tool according to anyone of the preceding clauses further comprising a substrate provided at a downbeam-facing surface of the objective lens and on which the sensor units are formed.

Clause 23: A tool according to clause 22 wherein the sensor units are configured to substantially fill the sample-facing surface.

Clause 24: A tool according to clause 22 or 23 wherein the sensor units are capture electrodes.

Clause 25: A tool according to anyone of the preceding clauses further comprising a substrate provided at an upbeam-facing surface of the objective lens and on which the sensor units are formed, preferably the sensor units are configured to face downbeam.

Clause 26: A tool according to clause 25 wherein the sensor units are selected from the group consisting of PIN detectors and scintillators.

Clause 27: A tool according to any one of clauses 22 to 26 further comprising control circuitry formed in the substrate.

Clause 28: A tool according to clause 27 wherein the control circuitry comprises one or more of: an amplifier, e.g. a trans-impedance amplifier; an analog-to-digital converter; a data multiplexor; and read-out gates.

Clause 29: A tool according to clause 28 wherein the control circuitry comprises one amplifier for each sensor unit.

Clause 30: A tool according to any one of clauses 22 to 29 further comprising conductive traces provided on the other side of the substrate to the sensor unit.

Clause 31: A tool according to any one of clauses 22 to 30 further comprising vias passing though the substrate.

Clause 32: A tool according to any one of clauses 22 to 31 wherein the substrate is formed of silicon.

Clause 33: A tool according to any one of the preceding clauses wherein the sensor units are formed by a CMOS process.

Clause 34: A tool according to any one of the preceding clauses wherein each sensor unit comprises a plurality of sensor elements.

Clause 35: A tool according to any one of the preceding clauses wherein the objective lens is an electrostatic lens.

Clause 36: A tool according to any one of the preceding clauses further comprising an actuation system configured to adjust the position of the sensor units in a direction parallel to the direction of propagation of the electron beams.

Clause 37: A tool according to any one of clauses 19 to 36 comprising: a first sensor unit array; a second sensor unit array; and an interchange mechanism configured to selectively position either of the first and second sensor unit arrays at a downbeam-facing surface of the objective lens; wherein the first and second sensor unit arrays are configured such that, when the respective array is positioned at the downbeam-facing surface, the sensor units of the first sensor unit array are positioned at a different distance from the objective than are the sensor units of the second sensor unit array.

Clause 38: A charged particle assessment tool comprising: an objective lens configured to project a plurality of charged particle beams onto a sample through a plurality of beam apertures defined in the objective lens; and a sensor array comprising sensor units adjacent respective beam apertures and configured to capture charged particles emitted from the sample; wherein the sensor array is configured to be adjustable between positions along beam paths of the charged particle beams.

Clause 39: A tool according to clause 38 wherein the sensor array is configured to be adjustable by actuating the sensor array along the beam paths.

Clause 40: A tool according to clause 39 further comprising an actuator configured to actuate the sensor array along the beam paths.

Clause 41: A charged particle assessment tool comprising: an objective lens configured to project a plurality of charged particle beams onto a sample through a plurality of beam apertures defined in the objective lens; and a sensor array comprising sensor units adjacent respective beam apertures and configured to capture charged particles emitted from the sample; wherein the sensor array is configured to be actuatable along beam paths of the charged particle beams.

Clause 42: A tool according to any one of clauses 36 to 41 further comprising an beam energy control system configured to control the landing energy of the electron beams on the sample.

Clause 43: A tool according to clause 36 to 42, further comprising a control lens array upbeam of the objective lens array.

Clause 44: A tool according to clause 43, wherein the objective lens array and control lens array comprises at least electrodes configured in operation such that the objective lens focuses the charged particle beam onto the sample and the control lens adjusts the beam opening angle and/or demagnification.

Clause 45: A multi-beam charged particle optical column configured to direct a multi-beam towards a sample, the multi-beam being generated down-beam from a source, the column comprising: a detector configured to capture charged particles emitted from the sample, wherein the detector is actuatable along the beam path.

Clause 46: A multi-beam charged particle optical column according to clause 45 wherein the detector comprises a sensor array, each sensor assigned to a respective sub-beam of the multi-beam.

Clause 47: A multi-beam charged particle optical column according to clause 45 or 46 wherein the column comprises a beam limiting aperture array configured to generate the multi-beams derived from a source beam.

Clause 48: A multi-beam charged particle optical column according to clause 47 wherein the detector is down-beam of the beam-limiting aperture array.

Clause 49: A multi-beam charged particle optical column according to any one of clauses 45 to 48 wherein the detector is integrated into the objective lens assembly comprising an objective lens.

Clause 50: A method of manufacturing an assessment tool, the method comprising: forming a plurality of sensor units on, and a plurality of apertures in, a substrate; and attaching the substrate to an objective lens configured to project a plurality of charged particle beams onto a sample, so that the charged particle beams can be emitted through the apertures.

Clause 51: A method according to clause 50 wherein the apertures are formed by etching through the substrate.

Clause 52: An inspection method comprising: emitting a plurality of charged-particle beams through a plurality of beam apertures to a sample; and capturing charged particles emitted by the sample in response to the charged-particle beams using a plurality of sensor units provided adjacent respective ones of the beam apertures.

Clause 53: A method according to clause 52 further comprising changing the position of the sensor units along a path of the charged particle beams.

Clause 54: A multi-beam electron-optical system comprising a last electron-optical element in a multi-beam path of the multi-beam electron optical system, the last electron-optical element comprising: a multi-manipulator array in which each array element is configured to manipulate at least one electron beam in the multi-beam path; and a detector configured and orientated to detect electrons emitted from a sample positioned in the multi-beam beam path, wherein the detector comprises a plurality of sensor units integrated into the multi-manipulator array and at least one sensor unit associated each array element.

Clause 55: A last electron-optical element for a multi-charged beam projection system configured to project a plurality of charged particle beams onto a sample, the last electron-optical element comprising: an objective lens having an sample-facing surface defining a plurality of beam apertures through which respective ones of the charged particle beams can propagate toward the sample; and a plurality of sensor units adjacent respective ones of the beam apertures and configured to capture charged particles emitted from the sample.

The descriptions above are intended to be illustrative, not limiting. Thus, it will be apparent to one skilled in the art that modifications may be made as described without departing from the scope of the claims set out below.

The invention claimed is:

1. A charged particle assessment tool comprising:
an objective lens array configured to project a plurality of charged particle beams onto a sample, the objective lens array defining a plurality of beam apertures through which respective ones of the charged particle beams can propagate toward the sample; and
a plurality of sensor units, each sensor unit substantially surrounding a respective one of the beam apertures, configured to capture charged particles emitted from the sample.

2. The tool according to claim 1, wherein each of the sensor units has a circular outer perimeter and has an area extending between the respective aperture of the sensor unit and the perimeter of the sensor unit.

3. The tool according to claim 1, further comprising a substrate provided at a downbeam-facing surface of the objective lens array and on which the sensor units are formed.

4. The tool according to claim 3, wherein the sensor units are configured to substantially fill a sample-facing surface.

5. The tool according to claim 4, wherein the sensor units are capture electrodes.

6. The tool according to claim 1, further comprising a substrate provided at an upbeam-facing surface of the objective lens array and on which the sensor units are formed.

7. The tool according to claim 1, wherein the plurality of sensor units are integrated into the objective lens array.

8. The tool according to claim 2, further comprising control circuitry formed in the substrate.

9. The tool according to claim 8, wherein the control circuitry comprises one or more selected from:
an amplifier;
an analog-to-digital converter;
a data multiplexor;
read-out gates.

10. The tool according to claim 2, further comprising vias passing though the substrate.

11. The tool according to claim 2, wherein each sensor unit comprises a plurality of sensor elements.

12. The tool according to claim 11, wherein the plurality of sensor elements divide each sensor unit radially.

13. The tool according to claim 11, wherein the plurality of sensor elements divide each sensor unit angularly.

14. The tool according to claim 1, wherein the beam apertures are arranged in a hexagonal array.

15. An inspection method comprising:
emitting a plurality of charged-particle beams through a plurality of beam apertures of an objective lens array to a sample; and
capturing charged particles emitted by the sample, in response to the charged-particle beams, using a plurality of sensor units, each sensor unit surrounding a respective one of the beam apertures and each sensor unit having a circular perimeter and an area extending between the respective aperture of the sensor unit and the perimeter of the sensor unit.

16. The inspection method according to claim 15, further comprising generating detection signals by the sensor units, and further comprising processing the detection signals by circuitry within a substrate that comprises the sensor units.

17. The tool according to claim 11, wherein the plurality of sensor elements of a sensor unit together have an area extending between the respective aperture of the sensor unit and a perimeter of the sensor unit.

18. A charged particle assessment tool comprising:
an objective lens array configured to project a plurality of charged particle beams onto a sample, the objective lens array defining a plurality of beam apertures through which respective ones of the charged particle beams can propagate toward the sample and the objective lens array being an electrostatic array objective lens; and
a plurality of sensor units, each sensor unit substantially surrounding a respective one of the beam apertures, configured to capture charged particles emitted from the sample.

19. The tool according to claim 18, wherein the objective lens array has at least two plates each with a plurality of holes or apertures.

20. The tool according to claim 19, wherein each sensor unit has a circular outer perimeter and has an area extending between the respective aperture of the sensor unit and the perimeter of the sensor unit.

* * * * *